US009459331B2

(12) United States Patent  
Otake et al.

(10) Patent No.: US 9,459,331 B2  
(45) Date of Patent: Oct. 4, 2016

(54) RF COIL AND MAGNETIC RESONANCE IMAGING DEVICE

(75) Inventors: Yosuke Otake, Tokyo (JP); Yoshihisa Soutome, Tokyo (JP); Ryota Sato, Tokyo (JP); Yoshitaka Bito, Tokyo (JP); Koji Hirata, Tokyo (JP)

(73) Assignee: HITACHI, LTD., Tokyo (JP)

( * ) Notice: Subject to any disclaimer, the term of this patent is extended or adjusted under 35 U.S.C. 154(b) by 636 days.

(21) Appl. No.: 13/984,855

(22) PCT Filed: Feb. 1, 2012

(86) PCT No.: PCT/JP2012/052270  
§ 371 (c)(1),  
(2), (4) Date: Aug. 12, 2013

(87) PCT Pub. No.: WO2012/111433  
PCT Pub. Date: Aug. 23, 2012

(65) Prior Publication Data  
US 2013/0314091 A1 Nov. 28, 2013

(30) Foreign Application Priority Data  
Feb. 14, 2011 (JP) ................................ 2011-028818

(51) Int. Cl.  
*G01R 33/3415* (2006.01)  
*G01R 33/36* (2006.01)  
*G01R 33/422* (2006.01)  
*G01R 33/34* (2006.01)

(52) U.S. Cl.  
CPC ......... *G01R 33/365* (2013.01); *G01R 33/3635* (2013.01); *G01R 33/3657* (2013.01); *G01R 33/3415* (2013.01); *G01R 33/34053* (2013.01); *G01R 33/34069* (2013.01); *G01R 33/34076* (2013.01); *G01R 33/3678* (2013.01); *G01R 33/422* (2013.01)

(58) Field of Classification Search  
CPC ............ G01R 33/365; G01R 33/3635; G01R 33/3415; G01R 33/3657; G01R 33/34053; G01R 33/34069  
See application file for complete search history.

(56) References Cited

U.S. PATENT DOCUMENTS 7,733,092 B2 * 6/2010 Otake .............. G01R 33/34046  
324/318  
2007/0285096 A1 * 12/2007 Soutome .......... G01R 33/34046  
324/318  
2008/0297154 A1 12/2008 Otake et al.

FOREIGN PATENT DOCUMENTS

JP 2007-97971 4/2007  
JP 2008-295737 12/2008

OTHER PUBLICATIONS

P. B. Roemer et al., The NMR Phased Array, Magnetic Resonance in Medicine 16, pp. 192-225, 1990.

*Primary Examiner* — Gregory H Curran  
(74) *Attorney, Agent, or Firm* — Baker Botts, L.L.P.

(57) ABSTRACT

To provide a technique for sufficiently eliminating magnetic coupling between RF coils and improving image quality when a multi-element multi-tuned RF coil is used as a receive RF coil for an MRI device. In the invention, each of RF coils which constitute a multi-element multi-tuned RF coil which is used as a receive RF coil for an MRI device is provided with an inter-coil magnetic coupling prevention circuit which resonates at each frequency to which each RF coil is tuned and provides a high impedance. The inter-coil magnetic coupling prevention circuit adjusts an inductor and a capacitor so that both of a circuit on the side of a pre-amplifier viewed from both ends of a signal reception circuit and a circuit on the side of the signal reception circuit viewed from both ends of a serial resonance circuit connected to the pre-amplifier resonate at a plurality of frequencies to which the respective RF coils are tuned.

16 Claims, 17 Drawing Sheets

FIG. 1
(a)
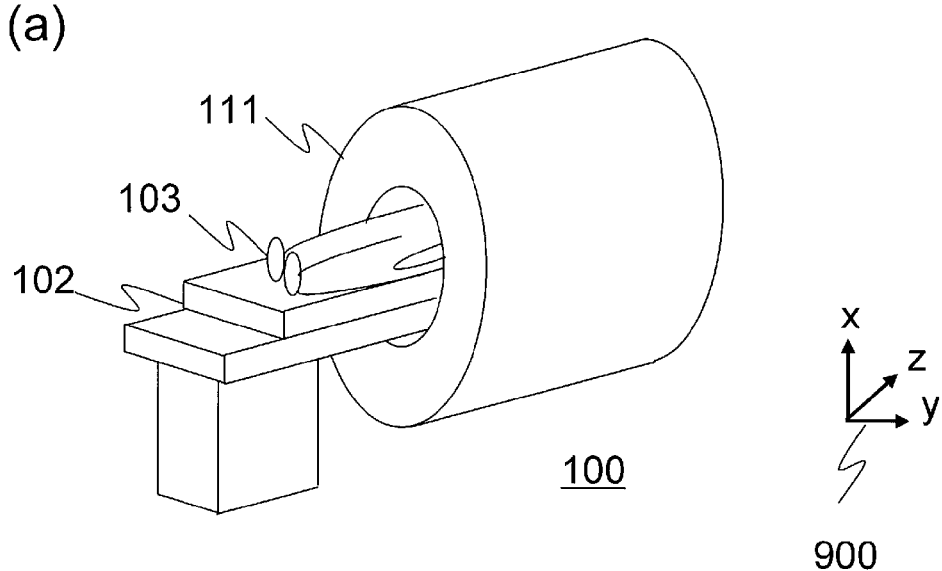
(b)
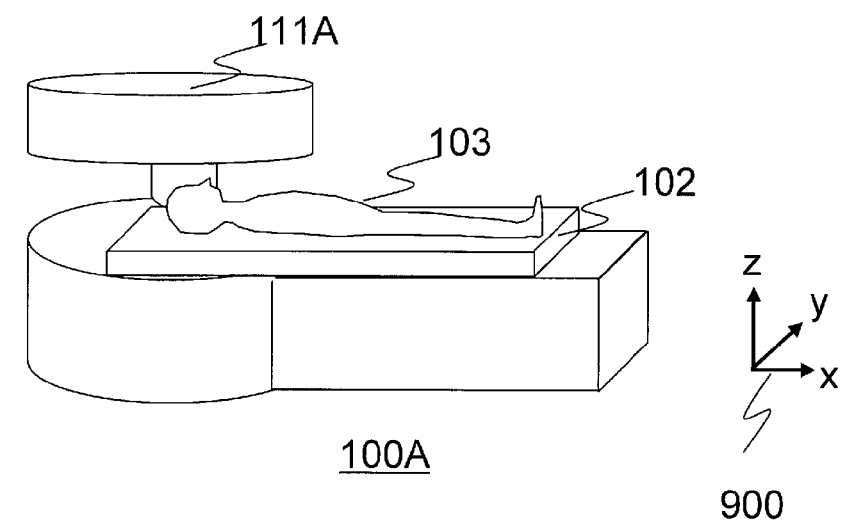

FIG. 4
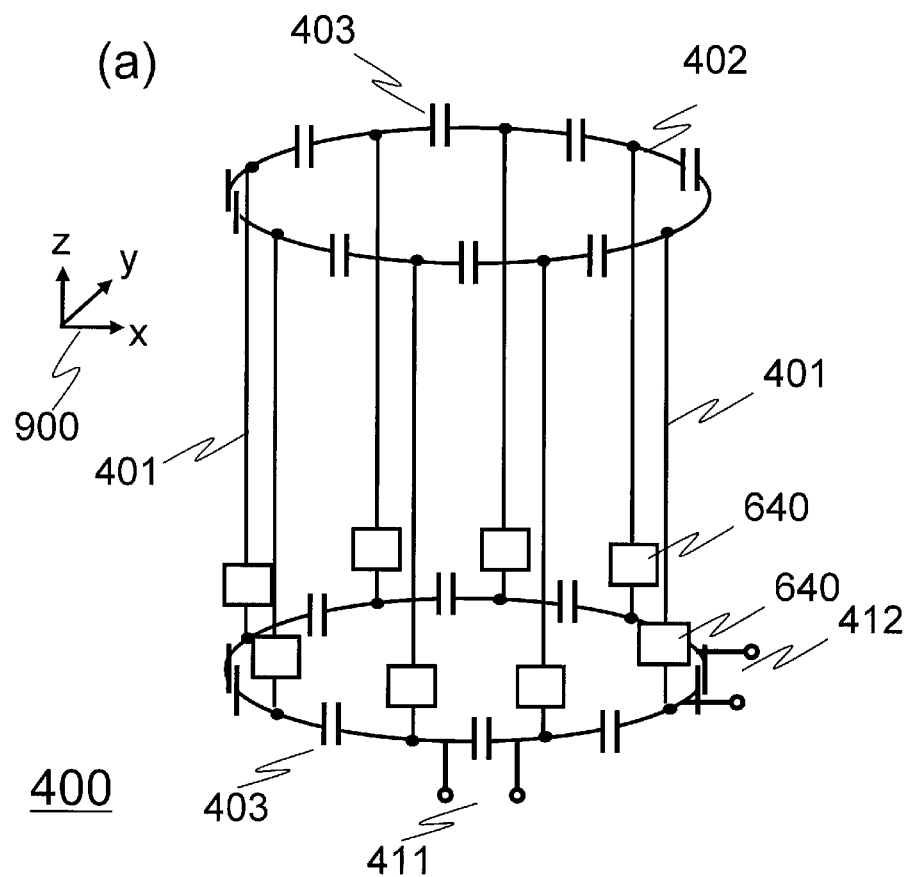
(a)
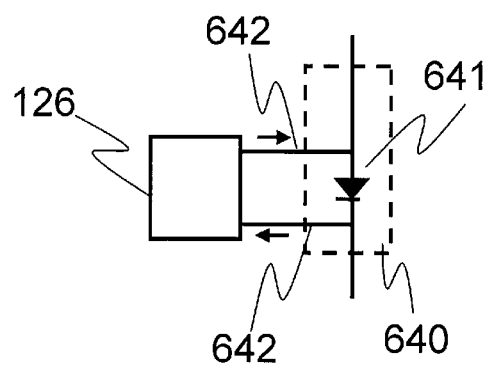
(b)

FIG. 10
(a)
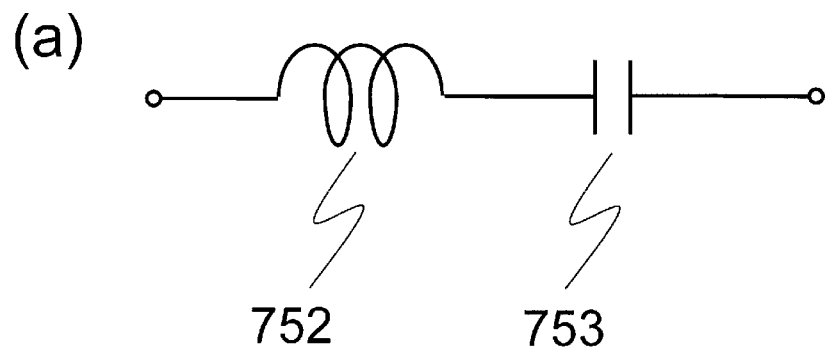
752   753
750
(b)
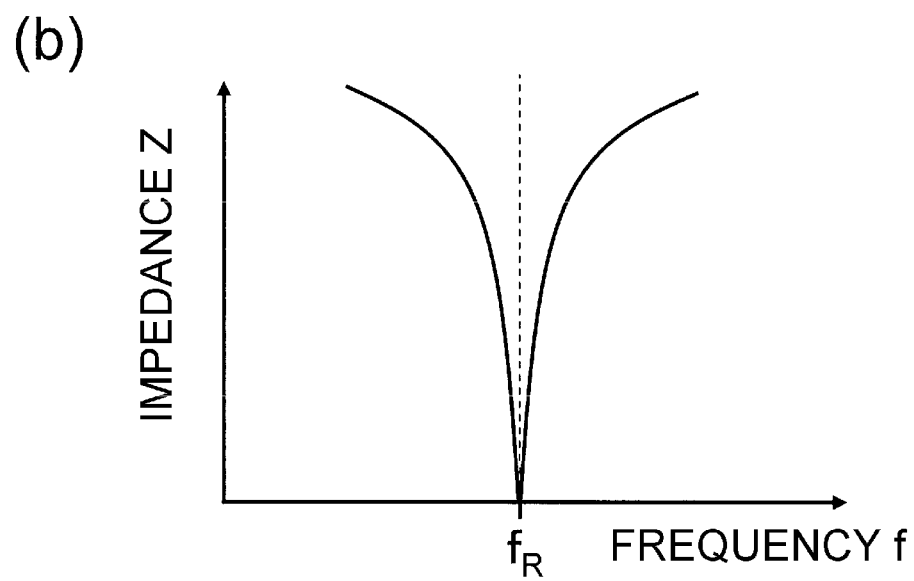

RF COIL AND MAGNETIC RESONANCE IMAGING DEVICE

TECHNICAL FIELD

The present invention relates to a magnetic resonance imaging (MRI) technique, and particularly, to a radio frequency (RF) coil for use in photographing of a nuclear magnetic resonance image of a plurality of nuclides.

BACKGROUND ART

MRI devices are diagnostic imaging devices for medical use which obtain, from a magnetic resonance signal that is generated by making atomic nuclei in an arbitrary cross-section across a test object cause magnetic resonance, a cross-sectional image in the cross-section. Generally, in MRIs, a magnetic resonance signal which is generated from a hydrogen nucleus ($^1H$) is a measurement object. However, the MRIs can also measure nuclear magnetic resonance signals of many nuclides such as fluorine ($^{19}F$), phosphorus ($^{31}P$), sodium ($^{23}Na$), and carbon ($^{13}C$).

For example, in order to simultaneously obtain images that are formed from nuclear magnetic resonance signals of a plurality of kinds of different atomic nuclei, it is necessary to apply a high-frequency magnetic field to excite the atomic nuclei, and to tune an RF coil which detects a nuclear magnetic resonance signal to frequencies (magnetic resonance frequencies) of the nuclear magnetic resonance signals of the plurality of atomic nuclei. Such a coil refers to a multi-tuned RF coil. Particularly, an RF coil which can receive nuclear magnetic resonance signals of two kinds of atomic nuclei refers to a double-tuned RF coil (for example, see PTL 1).

Common RF coils are required to have a high signal to noise ratio (SNR) in order to deal with weak signals. In response to this, there is a multi-element RF coil in which a plurality of RF coils are disposed and simultaneously driven.

As one multi-element RF coil, there is a phased array coil which has a plurality of RF coils arranged side by side to simultaneously receive signals.

In multi-element RF coils, magnetic coupling due to mutual magnetic induction is mainly generated between RF coils. This magnetic coupling causes image artifact and the like. Accordingly, it is necessary to prevent or suppress the magnetic coupling. For example, the following two methods are used to prevent or suppress the magnetic coupling (hereinafter, referred to as elimination of the magnetic coupling).

A first magnetic coupling elimination method is a method in which some of coil parts which transmit and receive high frequencies of a plurality of RF coils are disposed to overlap each other. In this method, mutual magnetic induction between two adjacent RF coils can be eliminated by appropriately adjusting an overlapping amount.

A second magnetic coupling elimination method is a method using a low-input impedance pre-amplifier (for example, see NPL 1). In this method, a high impedance is provided to both ends of a coil part by setting the low-input impedance pre-amplifier, an inductance which connects RF coils, and a matching capacitor of an RF coil on the condition that these resonate in parallel at a magnetic resonance frequency. As a result, a current having a magnetic resonance frequency flowing in the coil is reduced, and mutual magnetic induction between the coils can be eliminated.

In the case of the first magnetic coupling elimination method, the degree of freedom of the arrangement of the RF coils is low, and thus it is difficult to optimally adjust the arrangement to balance the elimination of the magnetic coupling with the improvement in receiving sensitivity. In addition, in the case of the second magnetic coupling elimination method, its elimination ability is lower than that of the first magnetic coupling elimination method. Particularly, the elimination function is not sufficient when strong magnetic coupling is generated between adjacent RF coils. Accordingly, in general, in the case of a phased array coil, the above methods are used in combination and the magnetic coupling is eliminated.

CITATION LIST

Patent Literature

PTL 1: JP-A-2008-295737

Non Patent Literature

NPL 1: Roemer P B, et. al., "The NMR Phased Array", Journal of Magnetic Resonance, USA, 1990, 16, P.192 to 225

SUMMARY OF INVENTION

Technical Problem

However, the above second magnetic coupling prevention method cannot be used when a multi-tuned RF coil is used as an RF coil of a phased array coil. The reason for this is that a high impedance can be provided to both ends of a coil part only at one frequency in the second magnetic coupling prevention method.

Accordingly, when a multi-element multi-tuned RF coil which has a plurality of multi-tuned RF coils arranged side by side is used, the magnetic coupling between the multi-tuned RF coils cannot be sufficiently eliminated, and thus image quality deteriorates.

The invention is contrived in view of the above-described circumstances, and an object of the invention is to provide a technique for sufficiently eliminating magnetic coupling between RF coils and improving image quality when a multi-element multi-tuned RF coil is used as an RF coil for an MRI device which transmits or receives a high-frequency signal.

Solution to Problem

In the invention, each of RF coils which constitute a multi-element multi-tuned RF coil which is used as a receive RF coilreceive RF coil for an MRI device is provided with an inter-coil magnetic coupling prevention circuit which resonates at each frequency to which each RF coil is tuned and provides a high impedance. The inter-coil magnetic coupling prevention circuit adjusts an inductor and a capacitor so that both of a resonance frequency on the side of a pre-amplifier viewed from both ends of a coil part and a resonance frequency on the side of the coil part viewed from both ends of a serial resonance circuit connected to the pre-amplifier are frequencies at which the RF coils resonate.

Specifically, there is provided an RF coil for a magnetic resonance imaging device including: a plurality of multi-tuned RF coils which have a plurality of different resonance frequencies, in which each multi-tuned RF coil is provided with a coil part which transmits or receives a high-frequency signal, and an inter-coil magnetic coupling prevention circuit which is connected in parallel to the coil part and prevents magnetic coupling with another multi-tuned RF coil, and the inter-coil magnetic coupling prevention circuit is provided with a tuning circuit which is connected in parallel to the coil part and makes the inter-coil magnetic coupling prevention circuit have a high impedance at the respective resonance frequencies of the multi-tuned RF coils, and a pre-amplifier which is connected to the output of the tuning circuit.

In addition, there is provided an RF coil system for a magnetic resonance imaging device which is provided with a transmit RF coil, a receive RF coilreceive RF coil, and coupling prevention means between the transmit RF coil and the receive RF coilreceive RF coil, in which the receive RF coilreceive RF coil is the above-described RF coil, the transmit RF coil can transmit a high-frequency signal having a resonance frequency of the multi-tuned RF coil of the RF coil, and the coupling prevention means between the transmit RF coil and the receive RF coilreceive RF coil performs control to open the respective multi-tuned RF coils when transmitting the high-frequency signal, and to open the transmit RF coil when receiving the nuclear magnetic resonance signal.

Furthermore, there is provided a magnetic resonance imaging device including: static magnetic field forming means for forming a static magnetic field; gradient magnetic field application means for applying a gradient magnetic field; a transmit RF coil which applies a high-frequency magnetic field to a test object; a receive RF coilreceive RF coil which receives a nuclear magnetic resonance signal from the test object; and control means for controlling operations of the gradient magnetic field application means, the transmit RF coil, and the receive RF coilreceive RF coil, in which the receive RF coilreceive RF coil is the above-described RF coil.

Advantageous Effects of Invention

According to the invention, in a multi-element multi-tuned RF coil for an MRI device, magnetic coupling between multi-tuned RF coils is sufficiently eliminated and image quality is improved.

BRIEF DESCRIPTION OF DRAWINGS

FIG. 1 shows (a) and (b) showing appearance diagrams of an MRI device of a first embodiment.

FIG. 4 shows (a) showing a diagram for illustrating a configuration of a birdcage RF coil of the first embodiment, and (b) showing a diagram for illustrating a configuration of a magnetic coupling prevention circuit.

FIG. 10 shows (a) and (b) showing diagrams for illustrating an operation of a common serial resonance circuit.

DESCRIPTION OF EMBODIMENTS

<<First Embodiment>>

Figure 2:
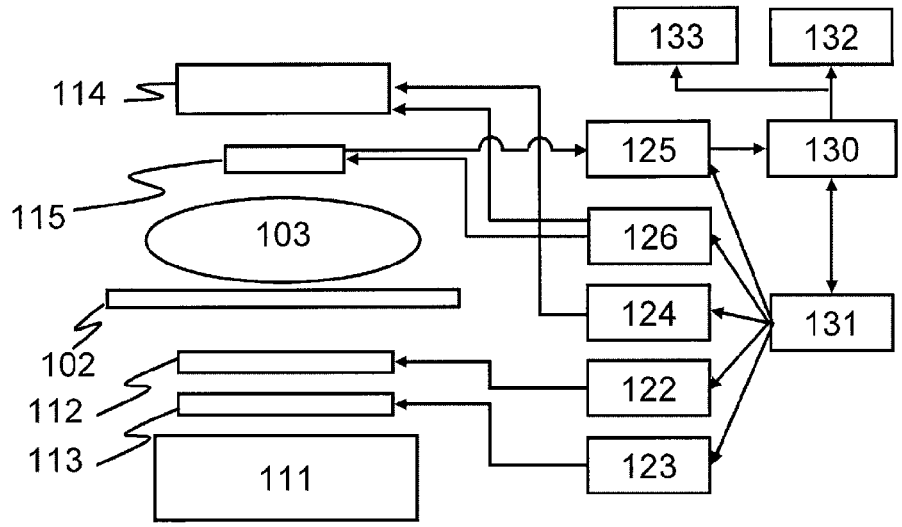
FIG. 2 is a block diagram of the MRI device of the first embodiment.

A first embodiment to which the invention is applied will be described. In this embodiment, a phased array coil in which each coil is a multi-tuned RF coil is used as a receive RF coilreceive RF coil. Hereinafter, in all of the drawings for illustrating embodiments of the invention, parts having the same function will be denoted by the same numerals and their repeated descriptions will be omitted.

First, the overall configuration of an MRI device of this embodiment will be described using FIG. 1. FIG. 1 show appearance diagrams of the MRI device of this embodiment. FIG. 1($a$) shows a horizontal magnetic field MRI device 100 using a tunnel-type magnet which forms a static magnetic field by a solenoid coil. FIG. 1($b$) shows a hamburger-type (open-type) vertical magnetic field MRI device 100A which uses a magnet separated in the vertical direction in order to increase an open feeling. These MRI devices 100 and 100A are provided with a table 102 on which a test object 103 is placed. This embodiment can be applied to any of the MRI device 100 provided with a horizontal magnetic field magnet 111 and the MRI device 100A provided with a vertical magnetic field magnet 111A.

Hereinafter, the MRI device 100 having the horizontal magnetic field magnet 111 will be described as an example. In this embodiment, any of the MRI devices having such appearances can be used. These are just an example, and the MRI device of this exemplary embodiment is not limited to these forms. In this embodiment, various known MRI devices can be used regardless of the form and type of the device.

In addition, a coordinate system 900 is used in which a z direction represents a direction of a static magnetic field, and a x direction and a y direction represent two directions perpendicular to the z direction, respectively. Hereinafter, the same coordinate system is used in all of the drawings of this specification.

FIG. 2 is a block diagram showing a schematic configuration of the MRI device 100. As shown in FIG. 2, the MRI device 100 is provided with the horizontal magnetic field magnet 111, a gradient magnetic field coil 112, a transmit RF coil 114, a receive RF coilreceive RF coil 115, a gradient magnetic field power source 122, a shim coil 113, a shim power source 123, a high-frequency magnetic field generator 124, a receiver 125, a magnetic coupling prevention circuit driving device 126, a calculator 130, a sequencer 131, a storing medium 132, and a display device 133. The reference numeral 102 represents a table on which a test object 103 is placed.

The gradient magnetic field coil 112 is connected to the gradient magnetic field power source 122 and forms a gradient magnetic field. The shim coil 113 is connected to the shim power source 123 and adjusts homogeneity of the magnetic field. The transmit RF coil 114 is connected to the high-frequency magnetic field generator 124 and applies (transmits) a high-frequency magnetic field to the test object 103. The receive RF coilreceive RF coil 115 is connected to the receiver 125 and receives a nuclear magnetic resonance signal from the test object 103. The magnetic coupling prevention circuit driving device 126 is connected to a magnetic coupling prevention circuit (not shown) which is connected to the transmit RF coil 114 and the receive RF coilreceive RF coil 15 and disposed therebetween.

The sequencer 131 gives a command to the gradient magnetic field power source 122, the high-frequency magnetic field generator 124, and the magnetic coupling prevention circuit driving device 126 to operate them. The command is transmitted in accordance with an instruction from the calculator 130. In addition, a magnetic resonance frequency serving as a criterion of detection by the receiver 125 is set in accordance with an instruction from the calculator 130. For example, a high-frequency magnetic field is applied to the test object 103 through the transmit RF coil 114 in accordance with a command from the sequencer 131. The nuclear magnetic resonance signal which is generated from the test object 103 by applying the high-frequency magnetic field is detected by the receive RF coilreceive RF coil 115 and detected by the receiver 125.

The calculator 130 controls the operations of the entire MRI device 100 and performs various signal processes. For example, the calculator 130 receives a signal detected by the receiver 125 via an A/D conversion circuit, and performs a signal process such as image reconfiguration. The result thereof is displayed on the display device 133. The detected signal and the measurement conditions are stored in the storing medium 132 as necessary. In addition, a command is transmitted to the sequencer 131 so as to operate the devices at a preprogrammed time and strength. Furthermore, when it is necessary to adjust the homogeneity of the static magnetic field, the sequencer 131 gives a command to the shim power source 123 to adjust the homogeneity of the magnetic field by the shim coil 113.

Next, the transmit RF coil 114 and the receive RF coilreceive RF coil 115 of this embodiment will be described in detail. In this embodiment, a case in which an RF coil (birdcage RF coil) 400 having a birdcage shape is used as the transmit RF coil 114, and a phased array coil 500 in which three RF coils (surface coils) having a loop shape are arranged is used as the receive RF coilreceive RF coil 115 will be described as an example.

In this embodiment, the birdcage RF coil 400 which is used as the transmit RF coil 114 is configured as a transmit RF coil which can excite two nuclides, and the phased array coil 500 which is used as the receive RF coilreceive RF coil 115 is configured by a double-tuned RF coil which can detect nuclear magnetic resonance signals of two nuclides which can be excited by the birdcage RF coil 400.

Figure 3:
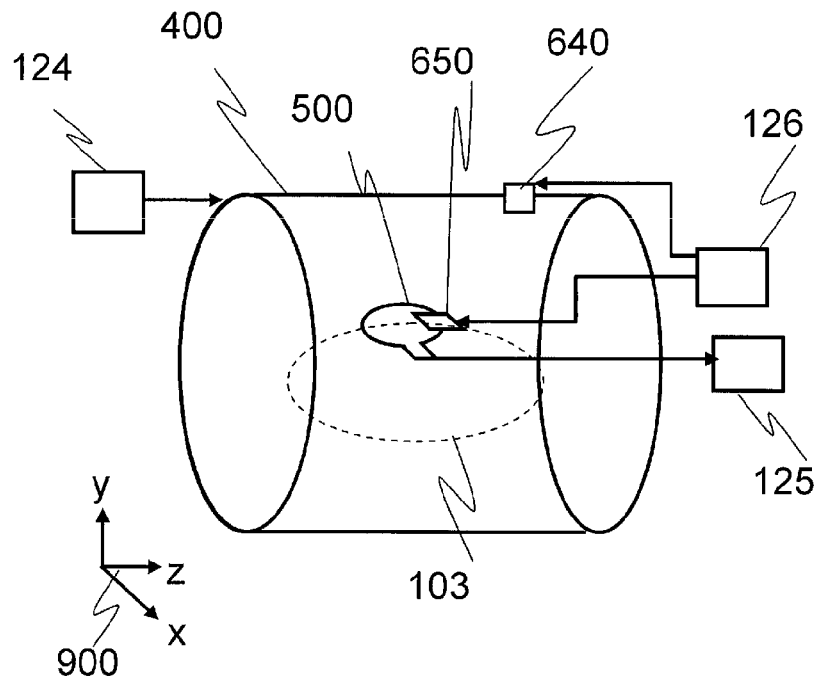
FIG. 3 is a diagram for illustrating connection between a transmit RF coil, a receive RF coilreceive RF coil, a high-frequency magnetic field generator, a receiver, and a magnetic coupling prevention circuit driving device of the first embodiment.

First, connection between the birdcage RF coil 400 which is used as the transmit RF coil 114, the phased array coil 500 which is used as the receive RF coilreceive RF coil 115, the high-frequency magnetic field generator 124, the receiver 125, and the magnetic coupling prevention circuit driving device 126 will be described in detail using FIG. 3. FIG. 3 is a block diagram for illustrating the connection therebetween.

As shown in FIG. 3, the axis of the birdcage RF coil 400 is disposed coaxially with the central axis of the magnet 111. The phased array coil 500 is disposed inside the birdcage RF coil 400. In addition, as described above, the birdcage RF coil 400 is connected to the high-frequency magnetic field generator 124. In addition, the phased array coil 500 is connected to the receiver 125. In this embodiment, the birdcage RF coil 400 is provided with a magnetic coupling prevention circuit 640 which is between the transmit RF coil and the receive RF coilreceive RF coil to prevent magnetic coupling with the phased array coil 500 (hereinafter, simply referred to as the magnetic coupling prevention circuit 640). The magnetic coupling prevention circuit 640 is inserted in series in the rectilinear conductor of the birdcage RF coil 400. In addition, the phased array coil 500 is provided with a magnetic coupling prevention circuit 650 which is between the transmit RF coil and the receive RF coilreceive RF coil to prevent magnetic coupling with the birdcage RF coil 400 (hereinafter, simply referred to as the magnetic coupling prevention circuit 650). The magnetic coupling prevention circuit 650 is inserted in series in each of surface coils which constitute the phased array coil 500. The magnetic coupling prevention circuit driving device 126 is connected to the magnetic coupling prevention circuit 640 and the magnetic coupling prevention circuit 650.

Next, the birdcage RF coil 400 which is used as the transmit RF coil 114 of this embodiment will be described using FIG. 4. The birdcage RF coil 400 of this embodiment operates as a double-tuned RF coil as described above. Hereinafter, frequencies of high-frequency signals to be applied are referred to as a first resonance frequency $f_1$ and a second resonance frequency $f_2$, respectively, and the first resonance frequency $f_1$ is smaller than the second resonance frequency $f_2$ ($f_1 < f_2$).

FIG. 4(a) is a block diagram for illustrating a configuration of the birdcage RF coil 400 of this embodiment. The birdcage RF coil 400 of this embodiment is provided with a plurality of rectilinear conductors 401, an end conductor 402 which connects end parts of the rectilinear conductors 401, and a capacitor 403 which is inserted in the end conductor 402. The magnetic coupling prevention circuit 640 is inserted in series in each rectilinear conductor 401. In addition, the birdcage RF coil 400 of this embodiment is provided with two input ports 411 and 412. The first port 411 is adjusted so that a high-frequency signal at the first resonance frequency $f_1$ is applied from the birdcage RF coil 400. The second port 412 is adjusted so that a high-frequency signal at the second resonance frequency $f_2$ is applied from the birdcage RF coil 400.

FIG. 4(*b*) is a diagram for illustrating a configuration of the magnetic coupling prevention circuit 640 which is inserted in the rectilinear conductor 401 of the birdcage RF coil 400, and connection with the magnetic coupling prevention circuit driving device 126. The magnetic coupling prevention circuit 640 is provided with a PIN diode 641 and a control signal line 642. The PIN diode 641 is inserted in series in the rectilinear conductor 401, and the control signal line 642 is connected to both ends of the PIN diode 641. The control signal line 642 is connected to the magnetic coupling prevention circuit driving device 126. A choke coil (not shown) is inserted in the control signal line 642 in order to avoid mixing of the high frequency.

In general, the PIN diode 641 exhibits a high resistance (OFF), and is characterized in that when the value of a direct current flowing in the forward direction of the PIN diode 641 is equal to or higher than a fixed value, the PIN diode 641 generally enters a conduction state (ON). In this embodiment, using this characteristic, ON/OFF of the PIN diode 641 is controlled by a direct current which is output from the magnetic coupling prevention circuit driving device 126. That is, when a high-frequency signal is transmitted, a control current is allowed to flow to make the PIN diode 641 enter a conduction state, and the birdcage RF coil 400 functions as the transmit RF coil 114, and when a nuclear magnetic resonance signal is received, the control current is stopped, and the birdcage RF coil 400 has a high impedance to enter an open state.

In this manner, in this embodiment, by controlling a direct current (control current) from the magnetic coupling prevention circuit driving device 126, the birdcage RF coil 400 functions as the transmit RF coil 114 when transmitting a high-frequency signal, and enters an open state to eliminate magnetic coupling with the phased array coil 500 which is the receive RF coilreceive RF coil 115 when receiving a nuclear magnetic resonance signal.

Next, the phased array coil 500 which is used as the receive RF coilreceive RF coil 115 of this embodiment will be described using FIGS. 5, 6, and 8. As described above, the phased array coil 500 of this embodiment is provided with three surface coils. Each surface coil operates as a double-tuned RF coil. Hereinafter, the surface coil operating as a double-tuned RF coil of the phased array coil 500 is referred to as a double-tuned surface coil.

First, an overall configuration of the phased array coil 500 of this embodiment will be described. FIG. 5 is a diagram for illustrating arrangement of three double-tuned surface coils 510 which constitute the phased array coil 500 of this embodiment.

Figure 5:
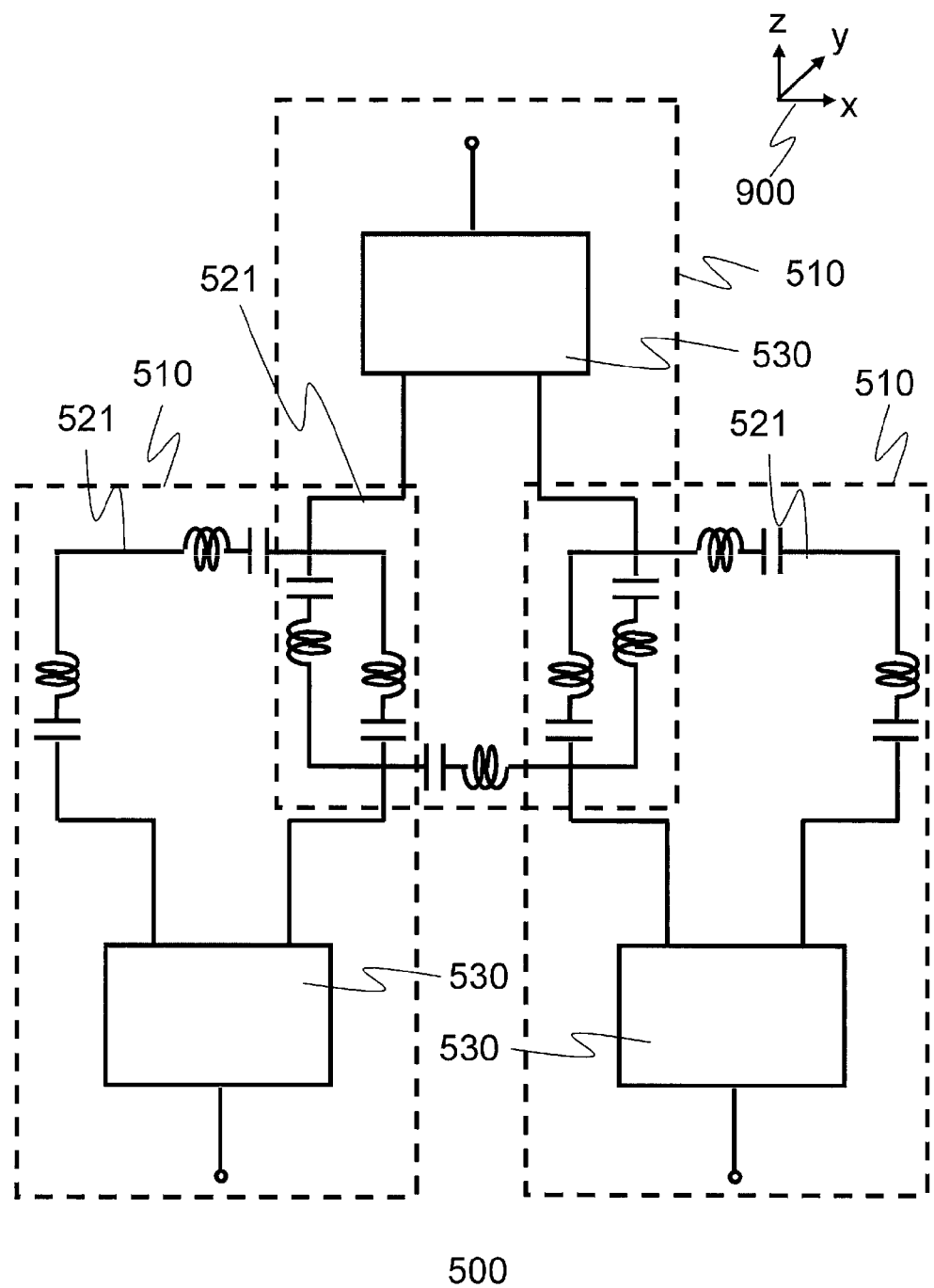
FIG. 5 is a diagram for illustrating a configuration of a phased array coil of the first embodiment.

As shown in FIG. 5, each double-tuned surface coil 510 of the phased array coil 500 of this embodiment is disposed so as to partially overlap with the adjacent double-tuned surface coils 510. The reason for this is to realize the first magnetic coupling elimination method. The position and the area of an overlapping part are adjusted so as to be able to eliminate magnetic coupling between the adjacent double-tuned surface coils 510.

Next, a configuration of each double-tuned surface coil 510 will be described using FIGS. 6 and 8.

Figure 6:
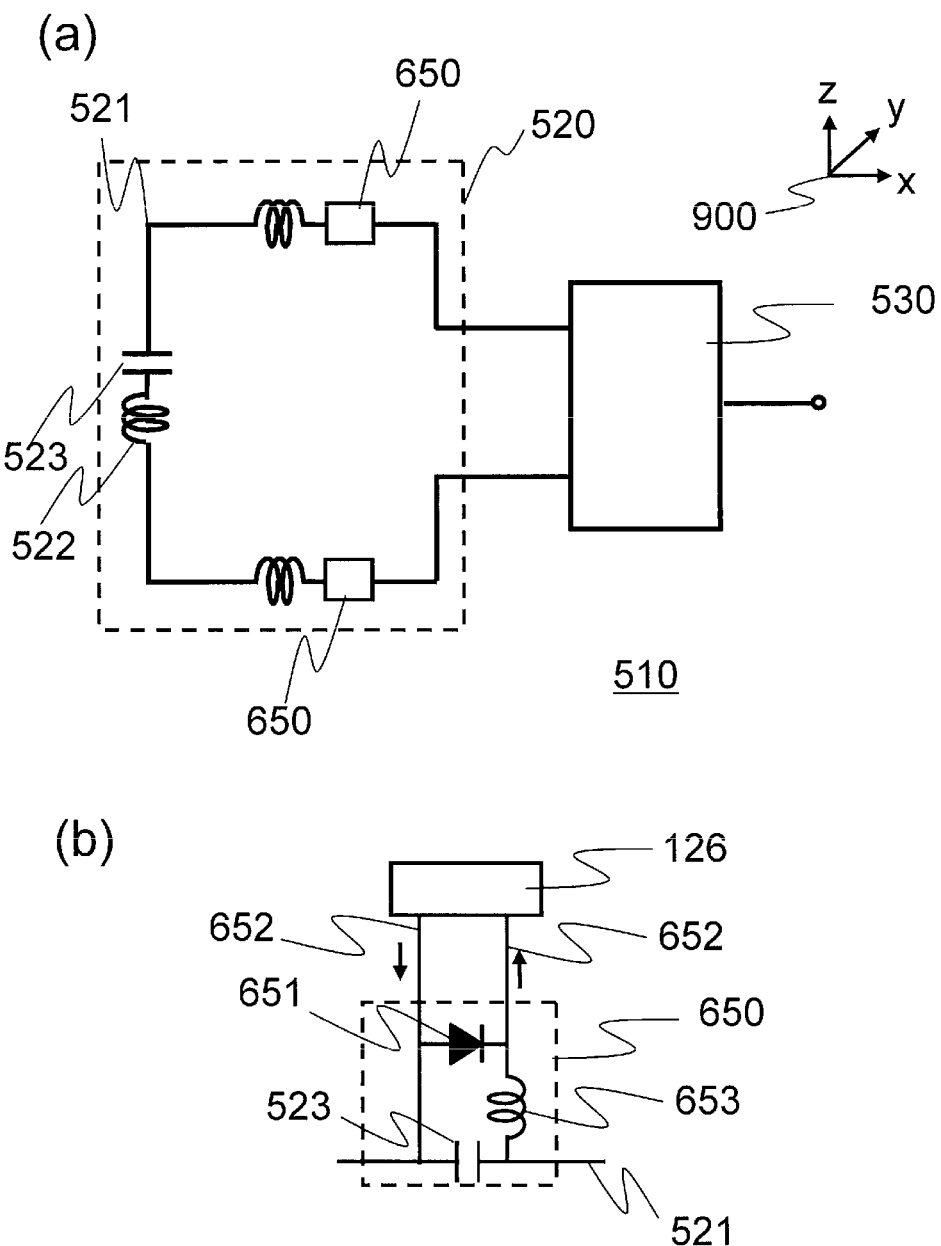
FIG. 6 shows (a) showing a diagram for illustrating a configuration of a double-tuned surface coil of the first embodiment, and (b) showing a diagram for illustrating a configuration of a magnetic coupling prevention circuit.

FIG. 6(*a*) is a block diagram for illustrating a configuration of the double-tuned surface coil 510 of this embodiment. The double-tuned surface coil 510 of this embodiment is provided with a coil part 520 which receives a nuclear magnetic resonance signal, and an inter-coil magnetic coupling prevention circuit 530 which prevents magnetic coupling between the double-tuned surface coils 510. In addition, the magnetic coupling prevention circuit 650 is inserted in series in a conductor 521 of the coil part 520.

The magnetic coupling prevention circuit 650 eliminates magnetic coupling with the birdcage RF coil 400 which is the transmit RF coil 114. The inter-coil magnetic coupling prevention circuit 530 which realizes the above-described second magnetic coupling elimination method in the double-tuned surface coil 510 will be described later in detail. In this embodiment, basically, magnetic coupling between the adjacent double-tuned surface coils 510 is eliminated by overlap arrangement, and magnetic coupling between the double-tuned surface coils 510 which are not adjacent to each other and magnetic coupling which cannot be sufficiently eliminated by overlap arrangement are eliminated by the inter-coil magnetic coupling prevention circuit 530.

First, elimination of magnetic coupling between the transmit RF coil and the receive RF coilreceive RF coil by the magnetic coupling prevention circuit 650 will be described. FIG. 6(*b*) is a diagram for illustrating a configuration of the magnetic coupling prevention circuit 650 which is inserted in the conductor 521 of the coil part 520, and connection with the magnetic coupling prevention circuit driving device 126.

The magnetic coupling prevention circuit 650 is provided with a PIN diode 651, an inductor 653, and a control signal line 652. The PIN diode 651 and the inductor 653 are connected in series, and are connected in parallel to a capacitor 523 which is inserted in the conductor 521 of the coil part 520. In addition, the control signal line 652 is connected to both ends of the PIN diode 651, and the control signal line 642 is connected to the magnetic coupling prevention circuit driving device 126. A choke coil (not shown) is inserted in the control signal line 642 in order to avoid mixing of the high frequency. The inductor 653 and the capacitor 523 are adjusted so as to resonate in parallel at a frequency of a nuclear magnetic resonance signal to be received.

In general, a parallel resonance circuit is characterized to have a high impedance (high resistance) at a resonance frequency. Accordingly, when a current flows to the PIN diode 651, the PIN diode 651 is switched ON, and the capacitor 523 of the coil part 520 resonates in parallel with the inductor 653 at a frequency of a nuclear magnetic resonance signal to be received, and has a high impedance. Accordingly, at the frequency of a nuclear magnetic resonance signal to be received, a part of the coil part 520 has a high impedance and enters an open state, and the double-tuned surface coil 510 having the coil part 520 also enters an open state.

In this manner, when the PIN diode 651 is switched ON with a current flowing thereto, magnetic coupling between each double-tuned surface coil 510 and the birdcage RF coil 400 is eliminated. Accordingly, magnetic coupling between the phased array coil 500 having the double-tuned surface coils 510 as coil elements and the birdcage RF coil 400 is also eliminated.

The magnetic coupling prevention circuit 650 provides a high impedance only at one frequency. Accordingly, in this embodiment, two magnetic coupling prevention circuits 650, the parallel resonance frequencies of which are the first resonance frequency $f_1$ and the second resonance frequency $f_2$, respectively, are inserted in one double-tuned surface coil 510. At any of the frequencies $f_1$ and $f_2$, the magnetic coupling between the transmit RF coil and the receive RF coilreceive RF coil is eliminated. The number of magnetic coupling prevention circuits 650 to be inserted is not limited thereto. Three or more magnetic coupling prevention circuits 650 may be inserted. In addition, means for preventing magnetic coupling between the transmission coil and the reception coil is not limited thereto. A switch circuit using only a diode can also be employed.

Next, a configuration and an operation of the double-tuned surface coil 510 of this embodiment will be described in detail. Here, the configuration and the operation will be described, focusing on the facts that the double-tuned surface coil 510 of this embodiment is tuned to the first resonance frequency $f_1$ and the second resonance frequency $f_2$, and magnetic coupling between the double-tuned surface coils 510 can be eliminated at these frequencies $f_1$ and $f_2$. Thus, an operation when a nuclear magnetic resonance signal is received will be described. Accordingly, the description will be given on the assumption that the transmit RF coil 114 is always in an open state. In addition, in the description of the operation, the description of the elimination of the magnetic coupling between the transmit RF coil 114 and the receive RF coilreceive RF coil 115 will be omitted.

Prior to the detailed description of the configuration and the operation of a single double-tuned RF coil 510 of this embodiment, a circuit configuration which realizes the second magnetic coupling elimination method when a conventional surface coil (single-tuned surface coil) which is tuned to only one frequency is configured as a multi-element RF coil will be described.

Figure 7:
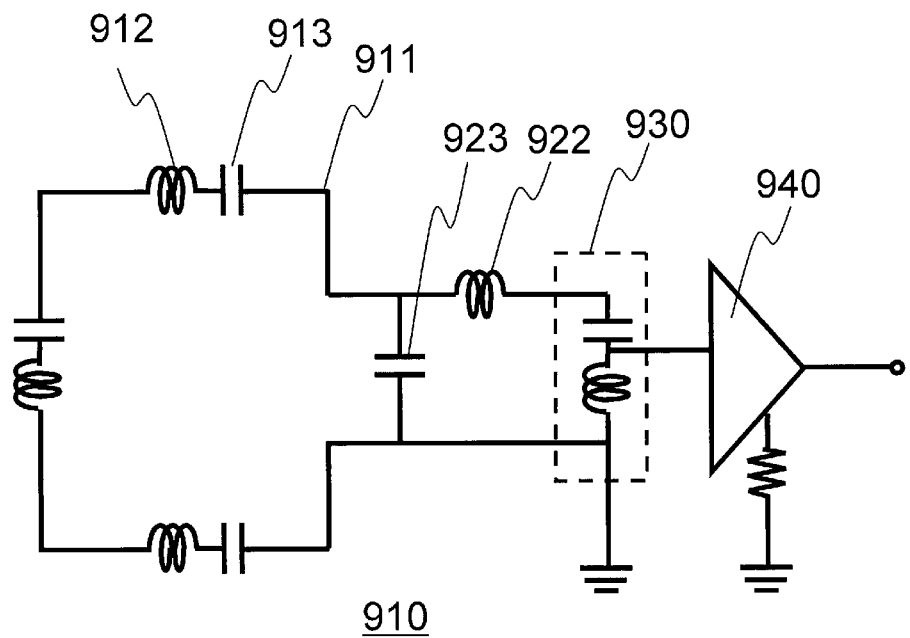
FIG. 7 is a diagram for illustrating a configuration of a conventional single-tuned surface coil.

FIG. 7 is a diagram for illustrating a circuit configuration of a conventional single-tuned surface coil 910. As shown in FIG. 7, the single-tuned surface coil 910 is provided with a signal reception part formed of a conductor 911 in which an inductor 912 and a capacitor 913 are inserted in an alternated manner, and an inter-coil element magnetic coupling elimination circuit part. The inter-coil element magnetic coupling elimination circuit part is provided with a capacitor 923, an inductor 922, an impedance matching circuit 930, and a pre-amplifier 940. The capacitor 923 is inserted in series in the conductor 911 of the signal reception part, and the inductor 922 is inserted between the capacitor 923 and the impedance matching circuit 930. In addition, the pre-amplifier 940 is connected to a connection point between the capacitor and the inductor which are connected in series in the impedance matching circuit 930. The impedance matching circuit 930 constitutes a serial resonance circuit with the inductor and the capacitor as shown in FIG. 7, and is adjusted so as to resonate at a magnetic resonance frequency to be received. In general, the serial resonance circuit has a low impedance (2 Ω or less) at a resonance frequency. Therefore, it is regarded to be almost in a conduction state at the frequency.

Accordingly, in the single-tuned surface coil 910, when the capacitor 923 and the inductor 922 are adjusted so as to resonate in parallel at a frequency (magnetic resonance frequency) of a nuclear magnetic resonance signal to be received, the single-tuned surface coil 910 provides a high impedance to both ends of the coil part at the magnetic resonance frequency to eliminate magnetic coupling between the elements. However, as described above, in the case of such a configuration, a high impedance can be provided to both ends of the coil part only at one frequency.

The inter-coil magnetic coupling prevention circuit 530 of the double-tuned surface coil 510 of this embodiment is to solve this problem, and provides a high impedance to the output of the coil part 520 at a plurality of different frequencies (here, two different frequencies). Hereinafter, a circuit configuration and an operation of the double-tuned surface coil 510 of this embodiment which realizes this solution will be described.

First, the circuit configuration of the double-tuned surface coil 510 will be described. FIG. 8 is a circuit diagram of the double-tuned surface coil 510 of this embodiment. As illustrated in FIG. 6(a), the double-tuned surface coil 510 of this embodiment is provided with the coil part 520 and the inter-coil magnetic coupling prevention circuit 530.

In the coil part 520, a plurality of capacitors 523 are inserted in series in the conductor 521 configured to have a loop shape. The conductor 521 has an inductor component. Therefore, in the circuit diagram, the conductor 521 is expressed as a serial resonance circuit of the capacitors 523 and the inductors 522 formed of a conductive inductor component as shown in FIG. 8.

Figure 8:
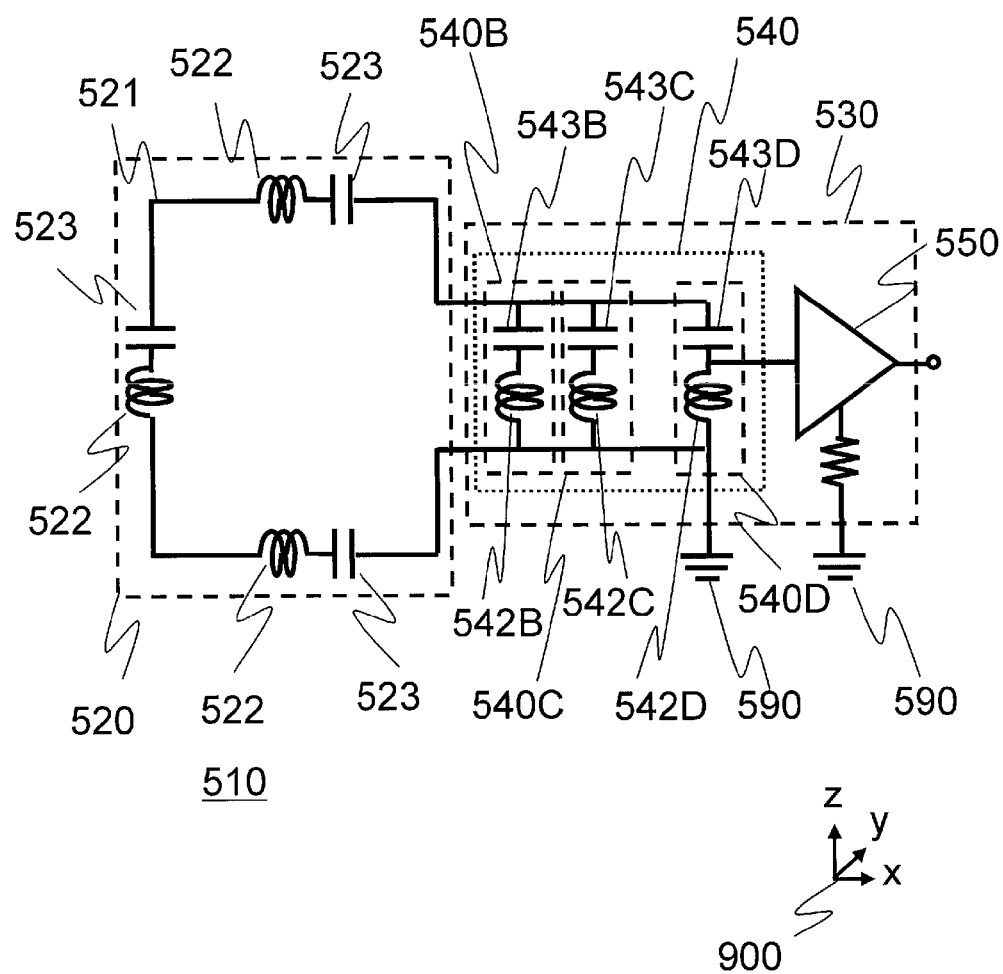
FIG. 8 is a circuit diagram of the double-tuned surface coil of the first embodiment.

FIG. 8 shows, as an example, a case in which three sets of inductors 522 and capacitors 523 are inserted. Each inductor 522 represents one inductor component when the coil part 520 of the double-tuned surface coil 510 formed of the conductor 521 is divided into three. The inductance of the entire conductor 521 is represented by $L_A$. For example, when the inductance $L_A$ of the double-tuned surface coil 510 is adjusted to a typical surface coil inductance 200 nH, the value of each inductor 522 is 66.7 nH.

In addition, each capacitor 523 represents a capacitor corresponding to one of three pieces into which a capacitor inserted in series in the coil part 520 of the double-tuned surface coil 510 is divided. The composite capacitance of the capacitor which is inserted in series is represented by $C_A$. The number of times of division is not limited thereto. It can be changed in accordance with the capacitance of the capacitor. In addition, values of the capacitors 523 may not be the same.

The inter-coil magnetic coupling prevention circuit 530 is provided with a tuning circuit 540 which is connected in parallel to the coil part 520 and a pre-amplifier 550 which is connected to the tuning circuit 540. The output terminal of the pre-amplifier 550 is connected to the receiver 125.

The tuning circuit 540 is provided with a plurality of serial resonance circuits having an inductor and a capacitor connected in series. The number of serial resonance circuits is greater by at least one than the number of frequencies to which the double-tuned surface coil 510 is tuned. In this embodiment, since there are two frequencies, i.e., the first resonance frequency $f_1$ and the second resonance frequency $f_2$ as tuning frequencies, a case in which the tuning circuit 540 is provided with three serial resonance circuits will be described as an example.

The respective serial resonance circuits are set as a first serial resonance circuit 540B, a second serial resonance circuit 540C, and a third serial resonance circuit 540D, respectively. In addition, the first serial resonance circuit 540B is provided with an inductor 542B having an inductance $L_B$ and a capacitor 543B having a capacitance $C_B$. The second serial resonance circuit 540C is also provided with an inductor 542C having an inductance $L_C$ and a capacitor 543C having a capacitance $C_C$. In addition, the third serial resonance circuit 540D is also provided with an inductor 542D having an inductance $L_D$ and a capacitor 543D having a capacitance $C_D$.

The coil part 520, the first serial resonance circuit 540B, the second serial resonance circuit 540C, and the third serial resonance circuit 540D are connected in parallel in this order. In addition, the input terminal of the pre-amplifier 550 is connected to a junction point between the inductor 542D and the capacitor 543D of the third serial resonance circuit 540D, and to a ground 590 via the inductor 542D. In addition, the output terminal of the pre-amplifier 550 is connected to the receiver 125.

The pre-amplifier 550 amplifies the voltage which is applied to the input terminal and outputs the amplified voltage to the output terminal. The pre-amplifier 550 has an input impedance of 1 kΩ or greater, and there is no current flow to the pre-amplifier 550. For example, a MOSFET pre-amplifier can be used. The type of the pre-amplifier which is used as the pre-amplifier 550 is not limited thereto.

Next, the operation of the double-tuned surface coil 510 of this embodiment having the above circuit configuration will be described.

The double-tuned surface coil 510 of this embodiment is tuned to nuclear magnetic resonance frequencies (first resonance frequency $f_1$ and second resonance frequency $f_2$) of two different kinds of atomic nuclei by adjusting the values of the inductors and the capacitors, and reduces currents having the nuclear magnetic resonance frequencies (first resonance frequency $f_1$ and second resonance frequency $f_2$) of the two different kinds of atomic nuclei, which flow to both ends of the coil part 520 of the double-tuned surface coil 510, thereby eliminating magnetic coupling between the double-tuned surface coils.

Here, the resonance frequencies of the coil part 520, the first serial resonance circuit 540B, the second serial resonance circuit 540C, and the third serial resonance circuit 540D are represented by $f_A$, $f_B$, $f_C$, and $f_D$, respectively. The resonance frequencies $f_A$, $f_B$, $f_C$, and $f_D$ of the serial resonance circuits are adjusted to satisfy the following Expressions (1) and (2) in order to realize the above functions.

$$f_B < f_1 < f_A < f_2 < f_C \quad (1)$$

$$f_B < f_1 < f_D < f_2 < f_C \quad (2)$$

In addition, in this embodiment, composite values ($L_A$, $C_A$) of the capacitor 523 and the inductor 522 of the coil part 520, and values ($C_D$, $L_D$) of the capacitor 543D and the inductor 542D of the third serial resonance circuit 540D are adjusted to be equal to each other. That is, $L_D$ and $L_A$ are adjusted to be equal to each other, and $C_D$ and $C_A$ are adjusted to be equal to each other. Accordingly, in this embodiment, $f_A$ is equal to $f_D$.

Hereinafter, a case will be described in which when the resonance frequencies of the coil part 520 and the serial resonance circuits 540B, 540C, and 540D are adjusted in accordance with the above Expressions (1) and (2), $L_A$ is equal to $L_D$, and $C_A$ is equal to $C_D$, the double-tuned surface coil 510 of this embodiment can obtain signals having two frequencies ($f_1$ and $f_2$) and magnetic coupling between the double-tuned surface coils 510 can be eliminated at the same two frequencies ($f_1$ and $f_2$).

Figure 9:
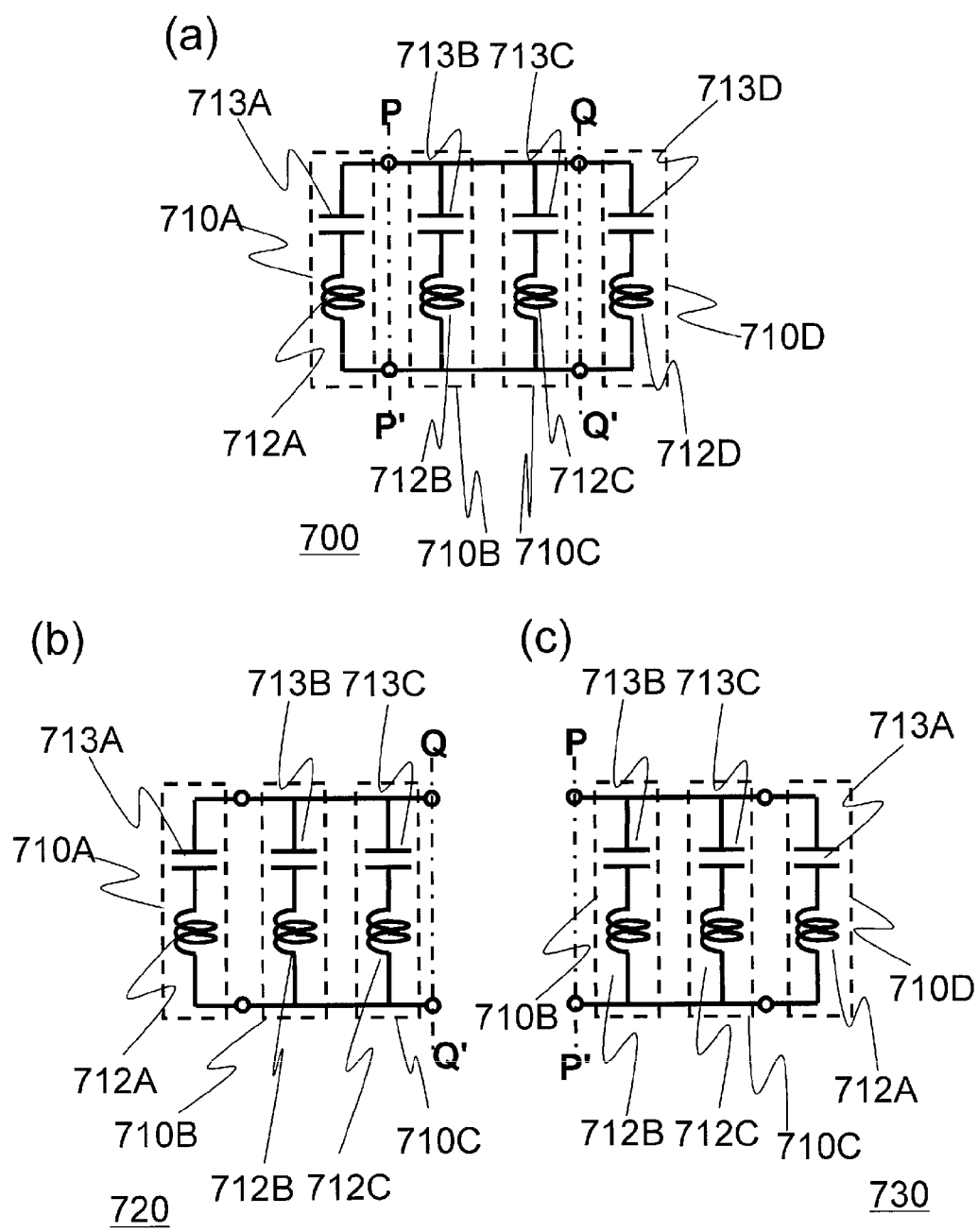
FIG. 9 shows (a) showing a circuit diagram of an equivalent circuit of the double-tuned surface coil of the first embodiment, and (b) and (c) showing circuit diagrams of a part of the equivalent circuit shown in (a).

An operation and characteristics of the double-tuned surface coil 510 of this embodiment will be described using its equivalent circuit. FIG. 9 shows diagrams for illustrating an operation of the double-tuned surface coil 510 using the equivalent circuit. FIG. 9(a) shows an equivalent circuit 700 of the double-tuned surface coil 510 of this embodiment. Here, the pre-amplifier 550 with no current flowing thereto due to a high input impedance will be omitted.

The equivalent circuit 700 is provided with an equivalent circuit (serial resonance circuit) 710A of the coil part 520 of the double-tuned surface coil 510, an equivalent circuit (serial resonance circuit) 710B of the first serial resonance circuit 540B, an equivalent circuit (serial resonance circuit) 710C of the second serial resonance circuit 540C, and an equivalent circuit (serial resonance circuit) 710D of the third serial resonance circuit 540D. In addition, the equivalent circuits (serial resonance circuits) 710A, 710B, 710C, and 710D are provided with inductors 712A, 712B, 712C, and 712D and capacitors 713A, 713B, 713C, and 713D, respectively, which have the composite values of the inductors and the capacitors of the coil part 520 and the serial resonance circuits 540B, 540C, and 540D. The inductances and the capacitances thereof are represented by $L_A$, $L_B$, $L_C$, $L_D$, $C_A$, $C_B$, $C_C$, and $C_D$, respectively, as described above.

First, a case will be described in which the double-tuned surface coil 510 (equivalent circuit 700) is tuned to the two different frequencies $f_1$ and $f_2$, and thus a magnetic resonance signal can be detected. Considering a voltage which is input to the pre-amplifier 550 which amplifies a detected signal, it will be easily described. Therefore, an operation on the side of the coil part 520 (equivalent circuit 710A) (on the left side of the broken line connecting Q and Q' in FIG. 9(a)) from both ends of the equivalent circuit (serial resonance circuit) 710D of the third serial resonance circuit 540D which is connected to the pre-amplifier 550 may be considered. FIG. 9(b) shows an equivalent circuit 720 on the left side of the broken line connecting Q and Q' in FIG. 9(a).

In the description of an operation of the equivalent circuit 720, first, a general operation of a serial resonance circuit 750 will be described. FIG. 10 is a diagram for illustrating an operation of the serial resonance circuit 750. As shown in FIG. 10(a), in the serial resonance circuit 750, an inductor 752 (having an inductance L) and a capacitor 753 (having a capacitance C) are connected in series. When the frequency of a voltage to be applied is represented by f and an angular frequency is represented by ω (ω=2πf), an impedance Z of both ends of the serial resonance circuit 750 is expressed by the following Expression (3).

[Exp. 1]

$$Z = j\omega L + \frac{1}{j\omega C} = j2\pi f L + \frac{1}{j2\pi f C} \quad (3)$$

The impedance Z changes depending on the frequency f as shown in FIG. 10(b) and resonates at the frequency $f = f_R$. $f_R$ represents a resonance frequency of the serial resonance circuit 750.

In FIG. 10(b), the impedance Z is expressed by the following Expression (4) at a frequency ($f_R < f$) higher than the resonance frequency $f_R$ of the serial resonance circuit 750, and the serial resonance circuit 750 operates as inductive reactance.

[Exp. 2]

$$Z = j2\pi f L \frac{(f/f_R)^2 - 1}{(f/f_R)^2} \quad (4)$$

At this time, a value L' of the apparent inductance of the serial resonance circuit 750 is expressed by the following Expression (5).

[Exp. 3]

$$L' = \frac{(f/f_R)^2 - 1}{(f/f_R)^2} L \quad (5)$$

On the other hand, the impedance Z is expressed by the following Expression (6) at a frequency ($f<f_R$) lower than the resonance frequency $f_R$ of the serial resonance circuit 750, and the serial resonance circuit 750 operates as capacitive reactance.

[Exp. 4]

$$Z = \frac{1 - (f/f_R)^2}{j2\pi fC} \quad (6)$$

At this time, a value C' of the apparent capacitance of the serial resonance circuit 750 is expressed by the following Expression (7).

[Exp. 5]

$$C' = \frac{C}{1 - (f/f_R)^2} \quad (7)$$

In this manner, in accordance with the frequency of a voltage to be applied, the serial resonance circuit 750 performs different operations with its resonance frequency as a boundary.

Figure 11:
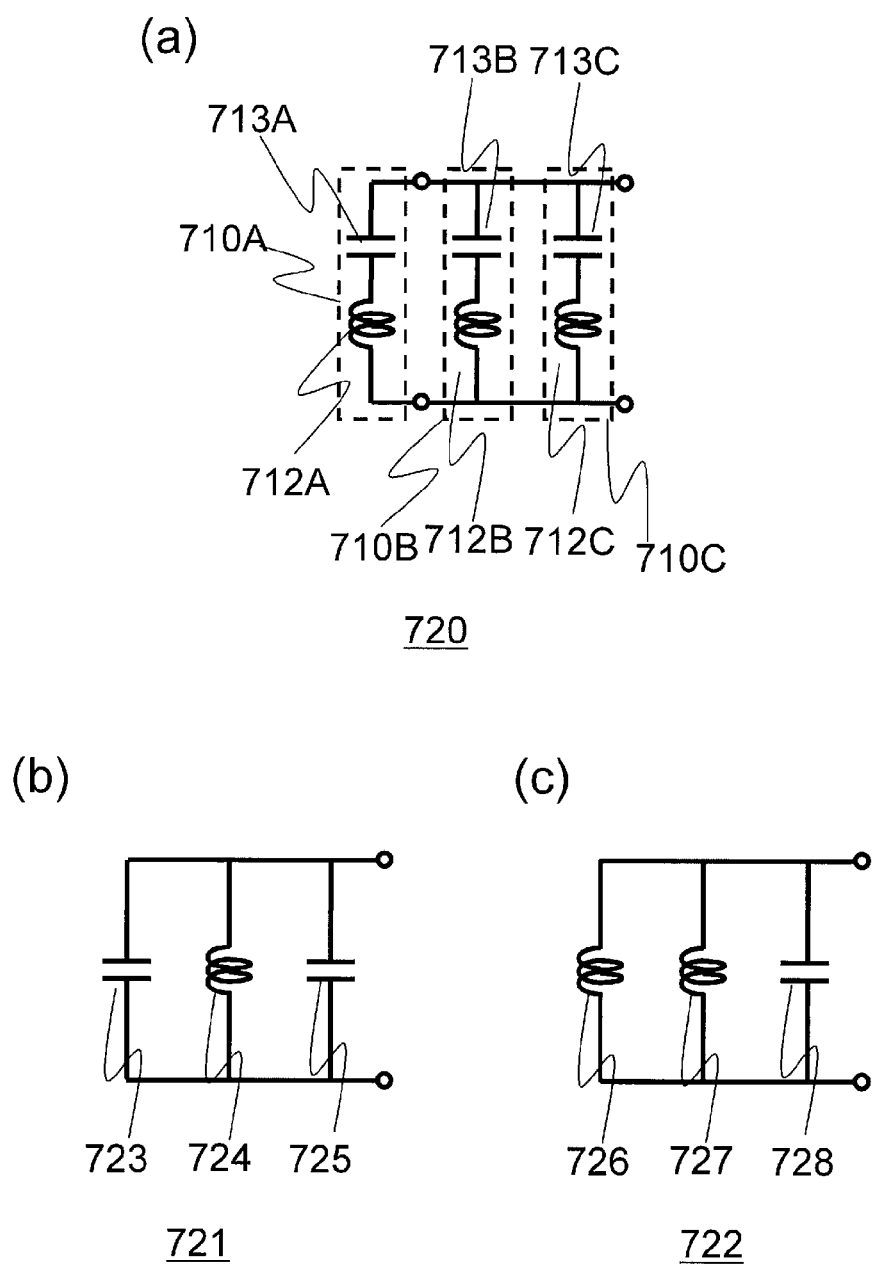
FIG. 11 shows (a) showing a circuit diagram of the equivalent circuit shown in FIG. 9($b$), and (b) and (c) showing diagrams for illustrating an operation of the equivalent circuit shown in FIG. 9($b$).

An operation of the equivalent circuit 720 will be described based on the general operation of the serial resonance circuit 750. FIG. 11 shows diagrams for illustrating an operation of the equivalent circuit 720. FIG. 11(a) is a circuit diagram of the equivalent circuit 720. Resonance frequencies $f_A$, $f_B$, and $f_C$ of the serial resonance circuits 710A, 710B, and 710C of the equivalent circuit 720 are adjusted to satisfy Expression (1).

Accordingly, when a high-frequency signal having the first resonance frequency $f_1$ is applied, the serial resonance circuits 710A and 710C of the equivalent circuit 720 operate as capacitive reactance (capacitor), and the serial resonance circuit 710B operates as inductive reactance (inductor). The configuration of an equivalent circuit 721 at this time is shown in FIG. 11(b).

As shown in FIG. 11(b), when a high-frequency signal having the first resonance frequency $f_1$ is applied, the equivalent circuit 721 is represented as a parallel resonance circuit 721 in which a capacitor 723 ($C_A'$), an inductor 724 ($L_B'$), and a capacitor 725($C_C'$) are connected in parallel.

When a high-frequency signal having the second resonance frequency $f_2$ is applied, the serial resonance circuits 710A and 710B of the equivalent circuit 720 operate as inductive reactance (inductor), and the serial resonance circuit 710C operates as capacitive reactance (capacitor). The configuration of an equivalent circuit 722 at this time is shown in FIG. 11(c).

As shown in FIG. 11(c), when a high-frequency signal having the second resonance frequency $f_2$ is applied, the equivalent circuit 722 is represented as a parallel resonance circuit 722 in which an inductor 726($L_A''$), an inductor 727 ($L_B''$), and a capacitor 728 ($C_C''$) are connected in parallel.

Accordingly, when values of capacitors and inductors to be inserted are adjusted so that the resonance frequency of the parallel resonance circuit 721 is adjusted to the first resonance frequency $f_1$ and the resonance frequency of the parallel resonance circuit 722 is adjusted to the second resonance frequency $f_2$, the equivalent circuit 720 resonates at the first resonance frequency $f_1$ and the second resonance frequency $f_2$. Accordingly, it is possible to detect the magnetic resonance signal.

Accordingly, the double-tuned surface coil 510 of this embodiment in which the left side of the broken line connecting Q and Q' in FIG. 9(b) is represented by the equivalent circuit 720 resonates at the first resonance frequency $f_1$ and the second resonance frequency $f_2$. That is, the double-tuned surface coil 510 of this embodiment resonates at these two frequencies ($f_1$ and $f_2$) to have sensitivity, and thus can receive magnetic resonance signals of these two frequencies ($f_1$ and $f_2$).

Next, a case will be described in which the double-tuned surface coil 510 of this embodiment can eliminate magnetic coupling at two different frequencies $f_1$ and $f_2$. Here, this case indicates that the current flowing to the both ends of the coil part 520 of the double-tuned surface coil 510 is reduced at these two frequencies $f_1$ and $f_2$. Accordingly, an operation on the side of the third serial resonance circuit 540D (on the right side of the broken line connecting P and P' in FIG. 9(a)) from both ends of the coil part 520 may be considered. An equivalent circuit 730 on the right side of the broken line connecting P and P' in FIG. 9(a) is shown in FIG. 9(c).

Here, the double-tuned surface coil 510 of this embodiment is configured so that the coil part 520 and the third serial resonance circuit 540D are the same circuits. Accordingly, the circuit diagram when viewing the third serial resonance circuit 540D from the both ends of the coil part 520, and the circuit diagram when viewing the coil part 520 from the both ends of the third serial resonance circuit 540D are electrically the same as each other. That is, the equivalent circuit 730 has the same characteristics as described in the description of the equivalent circuit 720.

Accordingly, when the values of the capacitors and the inductors are adjusted so that the equivalent circuit 720 resonates at the first resonance frequency $f_1$ and the second resonance frequency $f_2$, the equivalent circuit 730 also resonates in parallel at the same frequencies. Since the parallel resonance represents a high impedance at the resonance frequency, the third serial resonance circuit 540D side from the both ends of the coil part 520 of this embodiment provides a high impedance to the coil part 520 at the first resonance frequency $f_1$ and the second resonance frequency $f_2$. That is, the current flowing to the coil part 520 is reduced at the first resonance frequency $f_1$ and the second resonance frequency $f_2$. Accordingly, even when being influenced by magnetic interference from another double-tuned surface coil 510 which constitutes the phased array coil, the double-tuned surface coil 510 can eliminate mutual induction, because there is no current flowing to the coil part 520. Therefore, in the phased array coil 500 having the double-tuned surface coil 510 as a coil element, inter-coil magnetic coupling can be eliminated.

As described above, when adjusting the values of the capacitors and the inductors so that the configurations represented by the equivalent circuit 720 and the equivalent circuit 730 resonate at the first resonance frequency $f_1$ and the second resonance frequency $f_2$, the double-tuned surface coil 510 of this embodiment is tuned to the first resonance frequency $f_1$ and the second resonance frequency $f_2$, and can eliminate magnetic coupling between the double-tuned surface coils 510 when nuclear magnetic resonance signals of these frequencies are received.

Hereinafter, adjustment of the values $L_A$, $L_B$, $L_C$, and $L_D$ of the inductors 712A, 712B, 712C, and 712D and the values $C_A$, $C_B$, $C_C$, and $C_D$ of the capacitors 713A, 713B, 713C, and 713D, which constitute the coil part 520, the first serial resonance circuit 540B, the second serial resonance circuit 540C, and the third serial resonance circuit 540D, will be described using FIG. 11.

The values $C_A'$ and $C_C'$ of the capacitors 723 and 725 of the parallel resonance circuit 721 are expressed by the following Expressions (8) and (9) rather than Expression (7). In addition, the value $L_B'$ of the inductor 724 is expressed by the following Expression (10) rather than Expression (5).

[Exp. 6]

$$C_A' = \frac{C_A}{1-(f/f_A)^2} \tag{8}$$

[Exp. 7]

$$C_C' = \frac{C_C}{1-(f/f_C)^2} \tag{9}$$

[Exp. 8]

$$L_B' = \frac{(f/f_B)^2-1}{(f/f_B)^2}L_B \tag{10}$$

Here, in general, a relationship expressed by the following Expression (11) is created among a resonance frequency $f_{0P}$ of the parallel resonance circuit configured by the inductor and the capacitor, a value L of the inductor and a value C of the capacitor.

[Exp. 9]

$$f_{0P} = \frac{1}{2\pi\sqrt{LC}} \tag{11}$$

When performing the adjustment so that the parallel resonance circuit 721 is tuned to the first resonance frequency $f_1$, the resonance frequency of this parallel resonance circuit 721 becomes the first resonance frequency $f_1$, and thus the first resonance frequency $f_1$, the values $C_A'$ and $C_C'$ of the capacitors 723 and 725, and the value $L_B'$ of the inductor 724 satisfy Expression (11). Accordingly, the relationship between $f_1$, $C_A'$, $C_C'$, and $L_B'$ is expressed by the following Expression (12).

[Exp. 10]

$$f_1 = \frac{1}{2\pi\sqrt{L_B'(C_A'+C_C')}} \tag{12}$$

When solving Expressions (8), (9), (10), and (12) for $L_A$, $L_B$, and $L_C$, $L_A$, $L_B$, and $L_C$ have a relationship expressed by the following Expression (13).

[Exp. 11]

$$\frac{f_1^2}{f_1^2-f_B^2}\frac{1}{L_B} = \frac{f_1^2}{f_A^2-f_1^2}\frac{1}{L_A} + \frac{f_1^2}{f_C^2-f_1^2}\frac{1}{L_C} \tag{13}$$

Similarly, when solving Expressions (8), (9), (10), and (12) for $C_A$, $C_B$, and $C_C$, $C_A$, $C_B$, and $C_C$ have a relationship expressed by the following Expression (14).

[Exp. 12]

$$\frac{C_B}{(f_1/f_B)^2-1} = \frac{C_A}{1-(f_1/f_A)^2} + \frac{C_C}{1-(f_1/f_C)^2} \tag{14}$$

The values $L_A''$ and $L_B''$ of the inductors 726 and 727 of the parallel resonance circuit 722 are expressed by the following Expressions (15) and (16) rather than Expression (5). In addition, the value $C_C''$ of the capacitor 728 is expressed by the following Expression (17) rather than Expression (7).

[Exp. 13]

$$L_A'' = \frac{(f/f_A)^2-1}{(f/f_A)^2}L_A \tag{15}$$

[Exp. 14]

$$L_B'' = \frac{(f/f_B)^2-1}{(f/f_B)^2}L_B \tag{16}$$

[Exp. 15]

$$C_C'' = \frac{C_C}{1-(f/f_C)^2} \tag{17}$$

When performing the adjustment so that the parallel resonance circuit 722 is tuned to the second resonance frequency $f_2$, the resonance frequency of this parallel resonance circuit 722 becomes the second resonance frequency $f_2$, and thus the second resonance frequency $f_2$, the values $L_A''$ and $L_B''$ of the inductors 726 and 727, and the value $C_C''$ of the capacitor 728 satisfy Expression (11). That is, the relationship between $f_2$, $L_A''$, $L_B''$, and $C_C''$ is expressed by the following Expression (18).

[Exp. 16]

$$f_2 = \frac{1}{2\pi}\sqrt{\frac{L_A''^{-1}+L_B''^{-1}}{C_C''}} \tag{18}$$

When solving Expressions (15), (16), (17), and (18) for $L_A$, $L_B$, and $L_C$, $L_A$, $L_B$, and $L_C$ have a relationship expressed by the following Expression (19).

[Exp. 17]

$$\frac{f_2^2}{f_C^2-f_2^2}\frac{1}{L_C} = \frac{f_2^2}{f_2^2-f_A^2}\frac{1}{L_A} + \frac{f_2^2}{f_2^2-f_B^2}\frac{1}{L_C} \tag{19}$$

Similarly, when solving Expressions (15), (16), (17), and (18) for $C_A$, $C_B$, and $C_C$, $C_A$, $C_B$, and $C_C$ have a relationship expressed by the following Expression (20).

[Exp. 18]

$$\frac{C_C}{1-(f_2/f_C)^2} = \frac{C_A}{(f_2/f_A)^2-1} + \frac{C_B}{(f_2/f_B)^2-1} \tag{20}$$

It is necessary for $L_A$, $L_B$, and $L_C$ to satisfy Expressions (13) and (19) simultaneously. Accordingly, $L_B$ and $L_C$ are expressed by Expressions (21) and (22), respectively, using the resonance frequencies $f_1$, $f_2$, $f_A$, $f_B$, and $f_C$, and $L_A$.

[Exp. 19]

$$L_B = \left( \frac{f_C^2 - f_1^2}{f_1^2 - f_B^2} - \frac{f_C^2 - f_2^2}{f_2^2 - f_B^2} \right) \left( \frac{f_C^2 - f_2^2}{f_2^2 - f_A^2} + \frac{f_C^2 - f_1^2}{f_A^2 - f_1^2} \right)^{-1} L_A \quad (21)$$

[Exp. 20]

$$L_C = \left( \frac{f_2^2 - f_B^2}{f_C^2 - f_2^2} - \frac{f_1^2 - f_B^2}{f_C^2 - f_1^2} \right) \left( \frac{f_1^2 - f_B^2}{f_A^2 - f_1^2} + \frac{f_2^2 - f_B^2}{f_2^2 - f_A^2} \right)^{-1} L_A \quad (22)$$

It is necessary for $C_A$, $C_B$, and $C_C$ to satisfy Expressions (14) and (20) simultaneously. Accordingly, $C_B$ and $C_C$ are expressed by Expressions (23) and (24) rather than Expressions (14) and (20), respectively, using the resonance frequencies $f_1$, $f_2$, $f_A$, $f_B$, and $f_C$, and $C_A$.

[Exp. 21]

$$C_B = \qquad (23)$$
$$\left( \frac{1 - (f_1/f_C)^2}{1 - (f_1/f_A)^2} + \frac{1 - (f_2/f_C)^2}{(f_2/f_A)^2 - 1} \right) \left( \frac{1 - (f_1/f_C)^2}{(f_1/f_B)^2 - 1} - \frac{1 - (f_2/f_C)^2}{(f_2/f_B)^2 - 1} \right)^{-1} C_A$$

[Exp. 22]

$$C_C = \qquad (24)$$
$$\left( \frac{(f_1/f_B)^2 - 1}{1 - (f_1/f_A)^2} + \frac{(f_2/f_B)^2 - 1}{(f_2/f_A)^2 - 1} \right) \left( \frac{(f_2/f_B)^2 - 1}{1 - (f_2/f_C)^2} - \frac{(f_1/f_B)^2 - 1}{1 - (f_1/f_C)^2} \right)^{-1} C_A$$

Using the obtained relationships, the values of the capacitors and the inductors of the double-tuned surface coil 510 of this embodiment are calculated. Here, a case in which the first resonance frequency $f_1$ of the two different kinds of resonance frequencies is adjusted to a nuclear magnetic resonance frequency 282 MHz of fluorine at a static magnetic field strength 7 T (tesla) and the second resonance frequency $f_2$ is adjusted to a nuclear magnetic resonance frequency 300 MHz of a hydrogen nucleus at the static magnetic field strength 7 T will be described as an example.

First, the resonance frequency $f_A$ of the coil part 520 is determined. Since the first resonance frequency $f_1$ is 282 MHz and the second resonance frequency $f_2$ is 300 MHz, the resonance frequency $f_A$ of the coil part 520 is determined between 282 MHz and 300 MHz through Expression (1). Here, the resonance frequency $f_A$ is, for example, 291 MHz.

Next, the composite value $L_A$ of the inductor 522 of the coil part 520 is determined. Here, for example, when $L_A$ is adjusted to 200 nH which is a typical value of the inductor of the surface coil, the value of each of the three inductors 522 which constitute the coil part 520 becomes 67 nH.

Next, the composite value $C_A$ of the capacitor 523 of the coil part 520 is determined. Here, generally, in the serial resonance circuit, a resonance frequency $f_{OS}$ thereof, a value L of the inductor, and a value C of the capacitor have a relationship expressed by the following Expression (25).

[Exp. 23]

$$f_{os} = \frac{1}{2\pi \sqrt{LC}} \qquad (25)$$

When this is applied to the coil part 520, the composite value $C_A$ of the capacitor 523 becomes 1.54 pF. Accordingly, the value of each of the three capacitors 523 which constitute the coil part 520 becomes 4.62 pF.

Next, the resonance frequency $f_B$ of the first serial resonance circuit 540B and the resonance frequency $f_C$ of the second serial resonance circuit 540C are determined. These are determined to satisfy Expression (1). At this time, the resonance frequency $f_B$ and the resonance frequency $f_C$ are determined so that the values of the inductors 542B and 542C which are calculated through Expressions (21) and (22) are determined from 10 nH to 200 nH, and the values (capacitances) of the capacitors 543B and 543C which are calculated through Expressions (23) and (24) are determined from 2 pF to 200 pF. The reason for this is to reduce high-frequency loss and make it easy to perform the adjustment. The values of the capacitors and the inductors are not limited thereto. These may be in an adjustable range. Here, for example, the resonance frequency $f_B$ is adjusted to 266 MHz and the resonance frequency $f_C$ is adjusted to 316 MHz so as to be the resonance frequency $f_A \pm 25$ MHz.

Finally, using the resonance frequencies $f_1$, $f_2$, $f_A$, $f_B$, and $f_C$, $L_A$, and $C_A$ which are determined as described above, $L_B$, $L_C$, $C_B$, and $C_C$ are calculated in accordance with Expressions (21), (22), (23), and (24). As a result, $L_B$ is 62.3 nH, $L_C$ is 57.2 nH, $C_B$ is 5.74 pF, and $C_C$ is 4.43 pF.

In this manner, by adjusting $L_A$ to 200 nH, $L_B$ to 62.3 nH, $L_C$ to 57.2 nH, $C_A$ to 1.54 pF, $C_B$ to 5.74 pF, and $C_C$ to 4.43 pF, the double-tuned surface coil 510 of this embodiment resonates at both of the nuclear magnetic resonance frequency 282 MHz of fluorine at 7 T and the nuclear magnetic resonance frequency 300 MHz of a hydrogen nucleus at 7 T, and receives magnetic resonance signals of the fluorine and the hydrogen nucleus, when viewing the coil part 520 from the both ends of the third serial resonance circuit 540D which is an input impedance matching circuit of the pre-amplifier 550 (FIG. 9(b)).

In addition, in this embodiment, $L_A$ is adjusted to be equal to $L_D$ and $C_A$ is adjusted to be equal to $C_D$. Accordingly, when viewing the pre-amplifier 550 from the both ends of the coil part 520 (FIG. 9(c)), the double-tuned surface coil 510 also resonates at both of the nuclear magnetic resonance frequency 282 MHz of the fluorine at 7 T and the nuclear magnetic resonance frequency 300 MHz of the hydrogen nucleus at 7 T, and reduces, at these frequencies, the current at the magnetic resonance frequency flowing to the double-tuned surface coil 510. Accordingly, the double-tuned surface coil 510 of this embodiment can eliminate mutual magnetic induction between the double-tuned surface coils 510 (coil elements) at the nuclear magnetic resonance frequency 282 MHz of fluorine at 7 T and the nuclear magnetic resonance frequency 300 MHz of a hydrogen nucleus at 7 T.

As described above, the RF coil for the MRI device 100 of this embodiment is provided with a plurality of multi-tuned RF coils having a plurality of different resonance frequencies, and each multi-tuned RF coil is provided with a coil part which transmits or receives a high-frequency signal, and an inter-coil magnetic coupling prevention circuit which is connected in parallel to the coil part and prevents magnetic coupling with another multi-tuned RF coil. The inter-coil magnetic coupling prevention circuit is provided with a tuning circuit which is connected in parallel to the coil part and makes the inter-coil magnetic coupling prevention circuit have a high impedance at the respective resonance frequencies of the multi-tuned RF coils, and a pre-amplifier which is connected to the output of the tuning circuit.

At this time, the tuning circuit is provided with serial resonance circuits having different resonance frequencies in which a capacitor and an inductor are connected in series, and the number of the serial resonance circuits is greater by at least one than the number of frequencies at which the multi-tuned RF coils resonate. The respective serial resonance circuits are connected in parallel, and the pre-amplifier is connected to a junction point between the capacitor and the inductor of any one of the serial resonance circuits of the tuning circuit. The respective serial resonance circuits of the tuning circuit and the coil part may be adjusted so that both of the tuning circuit and the circuit which is configured by the serial resonance circuit and the coil part to which the pre-amplifier is not connected resonate at a plurality of different resonance frequencies of the multi-tuned RF coils.

In addition, the resonance frequencies of the serial resonance circuits of the tuning circuit are different from any of the resonance frequencies of the multi-tuned RF coils, and the resonance frequencies of the multi-tuned RF coils may be adjusted to be between the resonance frequencies of the serial resonance circuits.

In addition, the plurality of multi-tuned RF coils may be a phased array coil in which the multi-tuned RF coils are disposed in a substantially same plane so that the coil parts of the multi-tuned RF coils partially overlap each other.

Furthermore, the RF coil system for the MRI device 100 of this embodiment is an RF coil system of a magnetic resonance imaging device which is provided with a transmit RF coil, a receive RF coilreceive RF coil, and coupling prevention means between the transmit RF coil and the receive RF coilreceive RF coil. The receive RF coilreceive RF coil is the above-described RF coil, and the transmit RF coil can transmit a high-frequency signal having the resonance frequency of the multi-tuned RF coil of the RF coil. The coupling prevention means between the transmit RF coil and the receive RF coilreceive RF coil performs control to open the respective multi-tuned RF coils when transmitting the high-frequency signal, and to open the transmit RF coil when receiving the nuclear magnetic resonance signal.

In this manner, the double-tuned surface coil 510 of this embodiment resonates at two different frequencies $f_1$ and $f_2$ to have sensitivity and provides a high impedance to the both ends of the coil part 520 at the frequencies $f_1$ and $f_2$, thereby eliminating mutual magnetic induction between the double-tuned surface coils 510.

Accordingly, in the phased array coil 500 of this embodiment which has the plurality of double-tuned surface coils 510 as coil elements, magnetic resonance signals having two different frequencies $f_1$ and $f_2$ can also be received and mutual magnetic induction between the coils can be eliminated at the frequencies $f_1$ and $f_2$. Accordingly, by using the phased array coil 500 of this embodiment as the receive RF coilreceive RF coil 115, it is possible to effectively eliminate any inter-coil magnetic coupling at the frequency of any nuclear magnetic resonance signal to be received, and it is possible to provide an image having high image quality in which image artifact is suppressed.

Furthermore, the phased array coil 500 of this embodiment uses the double-tuned surface coil 510 as a coil element thereof. Therefore, since the coil can be disposed to be brought into close contact with a test object 103, a magnetic resonance signal around the contact portion can be detected at high sensitivity.

EXAMPLES

Hereinafter, a double-tuned surface coil 510 of this embodiment will be manufactured by way of trial, and results of evaluation on magnetic coupling elimination performance will be shown. Here, a double-tuned surface coil (invention trial RF coil) having a circuit configuration similar to that of the double-tuned surface coil 510 and a conventional double-tuned surface coil (conventional coil) are prepared to have the same size and outline shape, and compared in terms of high-frequency passing characteristics of a coil part.

The coil parts of the invention trial RF coil and conventional coil which have been trially manufactured are 80 mm by 60 mm in length and width and have a rectangular shape. The magnitude of the inductance is 210 nH.

In addition, fluorine and a hydrogen nucleus are set as reception object nuclides of the invention trial RF coil and the conventional coil. That is, both of the coils are prepared to be tuned to both of a nuclear magnetic resonance frequency 282 MHz of fluorine and a nuclear magnetic resonance frequency 300 MHz of a hydrogen nucleus at 7 T, and to receive magnetic resonance signals of fluorine and a hydrogen nucleus. Accordingly, a first resonance frequency $f_1$ of all of the invention trial RF coil and the conventional coil is 282 MHz, and a second resonance frequency $f_2$ thereof is 300 MHz.

The invention trial RF coil eliminates magnetic coupling at magnetic resonance frequencies of fluorine and a hydrogen nucleus. Accordingly, the invention trial RF coil has the same circuit configuration as that of the double-tuned surface coil 510 of the embodiment, a serial resonance frequency $f_A$ of a signal receiving part is adjusted to 291 MHz, a resonance frequency $f_B$ of a first serial resonance circuit is adjusted to 266 MHz, and a resonance frequency $f_C$ of a second serial resonance circuit is adjusted to 316 MHz.

Figure 12:
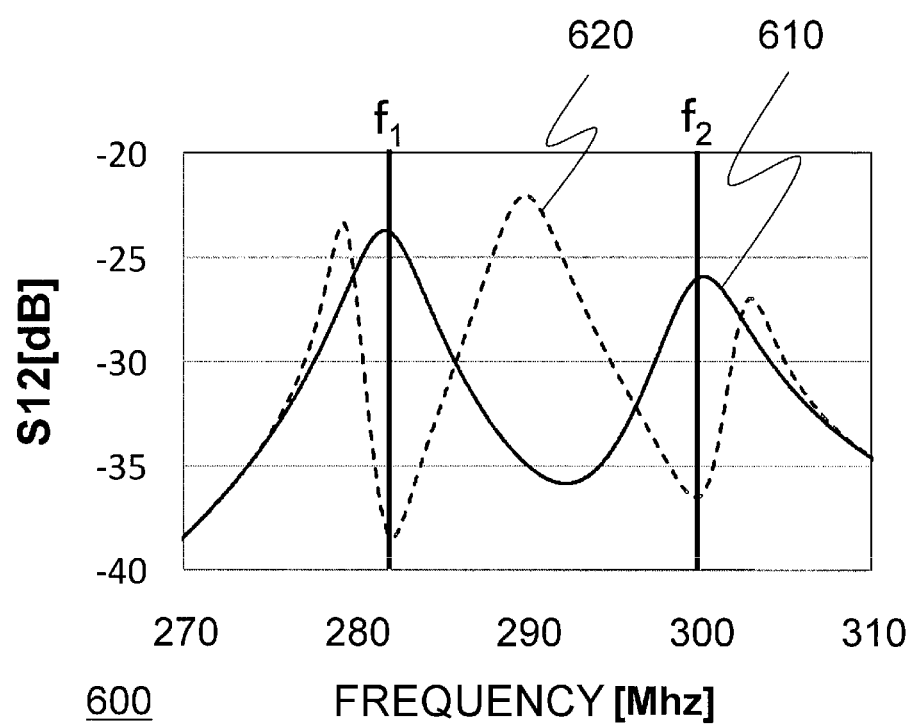
FIG. 12 is a graph showing results of comparison between the double-tuned surface coil of the first embodiment and a conventional coil in terms of magnetic coupling elimination performance.

FIG. 12 shows a graph 600 showing results of the comparison between the trially manufactured both coils in terms of magnetic coupling elimination performance. The horizontal axis represents a frequency, and the vertical axis represents high-frequency passing characteristics (S12). The high-frequency passing characteristics were measured by bringing two pickup loops (magnetic field probes), between which magnetic coupling was eliminated, close to the coil part. Specifically, using two pickup loops between which magnetic coupling was eliminated, high-frequency passing characteristics of the two pickup loops with the trially manufactured both coils interposed therebetween were measured. In general, according to this measurement method, the greater the high-frequency passing characteristics, the higher the degree of the magnetic coupling, and the less the high-frequency passing characteristics, the lower the degree of the magnetic coupling.

A solid line 610 represents the high-frequency passing characteristics of the conventional coil, and a broken line 620 represents the high-frequency passing characteristics of the invention trial RF coil. As shown in FIG. 12, as compared with the high-frequency passing characteristics of the conventional coil, the invention trial RF coil has low high-frequency passing characteristics at the frequencies of fluorine and a hydrogen nucleus ($f_1$=282 MHz, $f_2$=300). The above description shows that in this embodiment, magnetic coupling is smaller than in the conventional method.

In this embodiment, the case in which the nuclear magnetic resonance frequency of fluorine and a hydrogen nucleus is a combination of the first resonance frequency $f_1$ and the second resonance frequency $f_2$ has been described as an example. However, the combination of nuclides to be received is not limited thereto. For example, combinations of fluorine and helium ($^3$He), phosphorus ($^{31}$P) and lithium ($^7$Li), xenon ($^{129}$Xe) and sodium ($^{23}$Na), xenon ($^{129}$Xe) and carbon ($^{13}$C), sodium ($^{23}$Na) and carbon ($^{13}$C), oxygen ($^{19}$O) and heavy water ($^1$H), and the like can be thought. Obviously, the combination of atomic nuclei is not limited thereto.

In addition, the shape of the double-tuned surface coil 510 of this embodiment is not limited to the above shape. The equivalent circuit thereof may be the same as the equivalent circuit 700.

Figure 13:
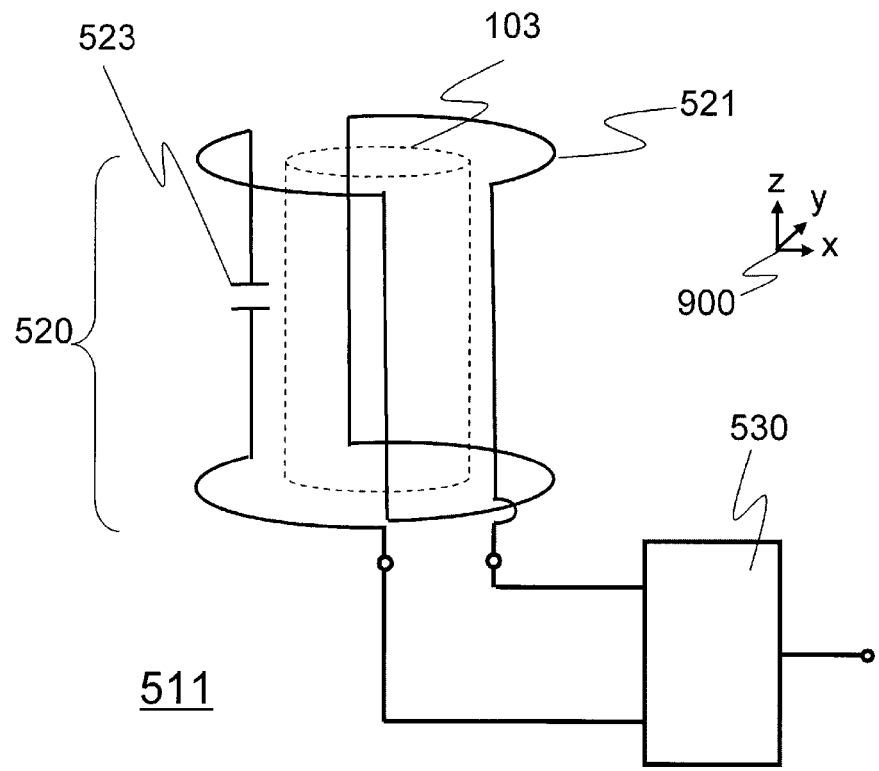
FIG. 13 is a diagram for illustrating a double-tuned saddle-type coil of the first embodiment.

For example, the coil part 520 of the double-tuned surface coil 510 may have a shape of a saddle-type coil. FIG. 13 shows a double-tuned saddle-type coil 511 which is a modification example of the double-tuned surface coil 510 of this embodiment. As shown in FIG. 13, in a coil part 520 of the double-tuned saddle-type coil 511, a conductor 521 thereof forms two saddle-shaped parts which are disposed to be opposed to a surface of a virtual cylinder. In addition, the two saddle-shaped parts are disposed so that magnetic fields to be formed are in the same direction.

Figure 14:
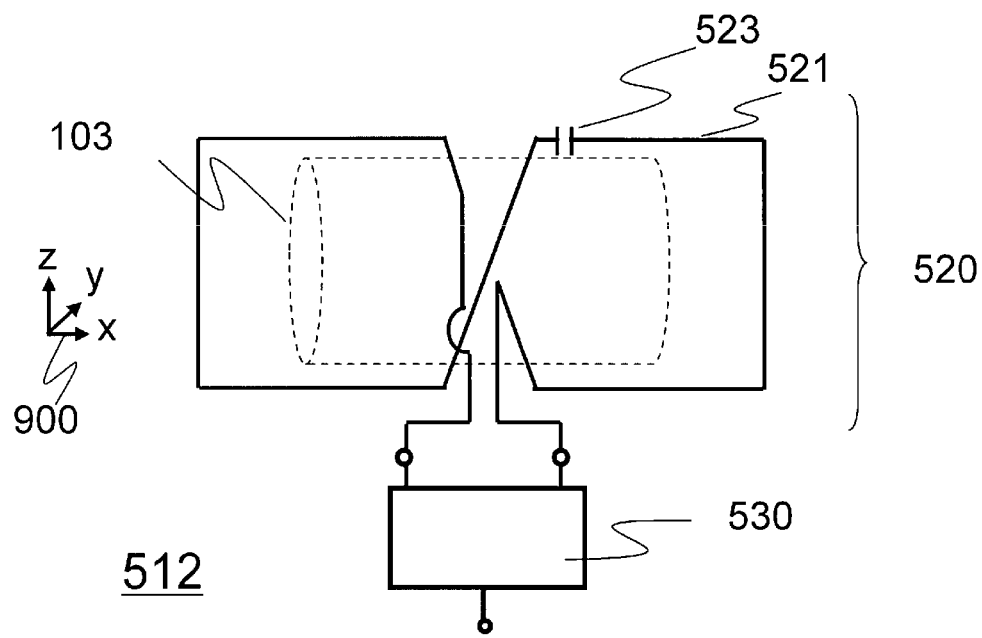
FIG. 14 is a diagram for illustrating a double-tuned butterfly-type coil of the first embodiment.

In addition, the coil part 520 of the double-tuned surface coil 510 may have a shape of a butterfly-type coil. FIG. 14 shows a double-tuned butterfly-type coil 512 which is a modification example of the double-tuned surface coil 510 of this embodiment. As shown in FIG. 14, in the double-tuned butterfly-type coil 512, a conductor 521 thereof forms two loop coil parts which are disposed in a substantially same plane. In addition, the two loop coil parts are connected so that magnetic fields to be formed are in the opposite directions.

Figure 15:
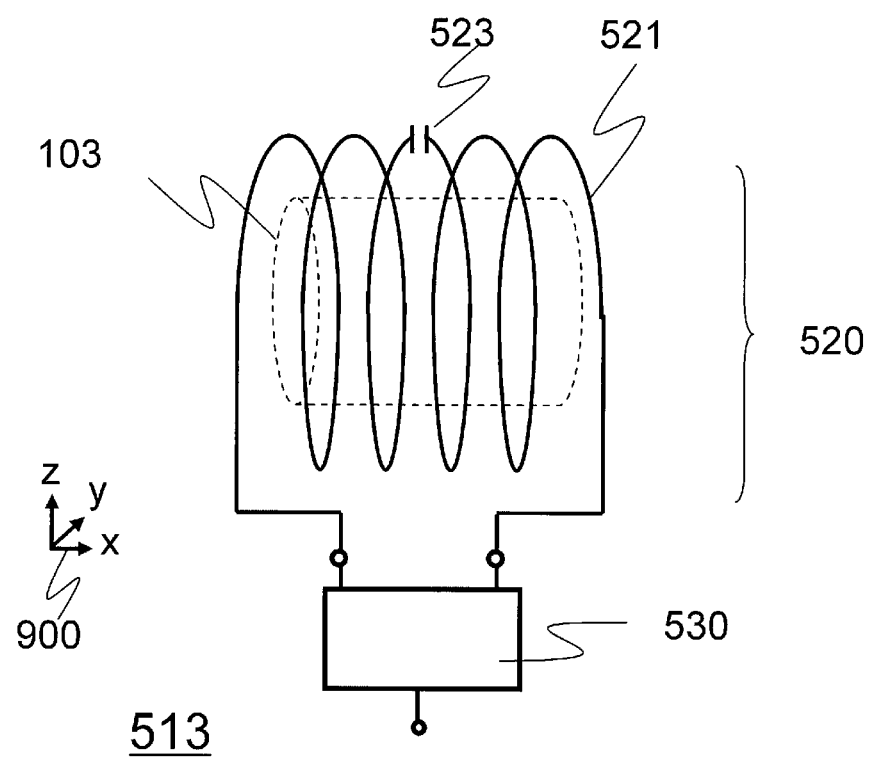
FIG. 15 is a diagram for illustrating a double-tuned solenoid coil of the first embodiment.

For example, the coil part 520 of the double-tuned surface coil 510 may have a shape of a solenoid coil. FIG. 15 shows a double-tuned solenoid coil 513 which is a modification example of the double-tuned surface coil 510 of this embodiment.

Equivalent circuits of these double-tuned saddle-type coil 511, the double-tuned butterfly-type coil 512, and the double-tuned solenoid coil 513 are the same as the equivalent circuit 700 of the double-tuned surface coil 510. Accordingly, these are operated similarly to the double-tuned surface coil 510. Therefore, the double-tuned saddle-type coil 511, the double-tuned butterfly-type coil 512, and the double-tuned solenoid coil 513 can detect nuclear magnetic resonance signals having two different kinds of frequencies, and can eliminate mutual magnetic induction between the coils by reducing the current flowing to both ends of the coil part 520 at frequencies of two kinds of detectable nuclear magnetic resonance signals. Accordingly, when these coils are used to constitute a multi-element double-tuned coil, thereby forming a reception coil 115, it is possible to obtain an image having high image quality in which artifact is suppressed.

In addition, the coil part 520 of the double-tuned saddle-type coil 511 has a saddle shape. Accordingly, as shown in FIG. 13, when a test object 103 such as an arm, a foot, or a body of an object to be tested is disposed in this saddle-shaped part, two kinds of nuclear magnetic resonance signals can be uniformly detected at high sensitivity not only from a surface but also from a deep part of the test object 103.

In addition, the coil part 520 of the double-tuned butterfly-type coil 512 has a butterfly shape. Accordingly, a test object 103 such as an arm, a foot, or a body of an object to be tested does not enter a closed space. As shown in FIG. 14, when the test object 103 is disposed in an upper part or a lower part of the coil part 520 having a butterfly shape, two kinds of nuclear magnetic resonance signals can be uniformly detected at high sensitivity from a deep part of the test object 103.

In addition, the coil part 520 of the double-tuned solenoid coil 513 has a shape of a solenoid coil. Accordingly, as shown in FIG. 15, when a test object 103 such as an arm, a foot, or a body of an object to be tested is disposed in this solenoid coil, two kinds of magnetic resonance signals can be uniformly detected at high sensitivity not only from a surface but also from a deep part of the test object 103. The solenoid coil has a uniform sensitivity distribution in a wider region than in the case of the saddle-type coil.

In the modification examples shown in FIGS. 13, 14, and 15, the case in which one capacitor 523 is disposed for a conductor 521 which constitutes the loop has been exemplified, but a plurality of capacitors 523 may be disposed.

In addition, in this embodiment, values ($C_A$, $C_D$) of capacitors 523A and 523D and values ($L_A$, $L_D$) of inductors 522A and 522D are adjusted so that $L_D$ is equal to $L_A$ and $C_D$ is equal to $C_A$, but are not limited thereto. The values may be adjusted so that the inter-coil magnetic coupling prevention circuit 530 can provide a high impedance to the coil part 520 at the first resonance frequency $f_1$ and the second resonance frequency $f_2$ which are received by the double-tuned surface coil 510.

In addition, in this embodiment, the resonance frequency $f_B$ of the first serial resonance circuit and the resonance frequency $f_C$ of the second serial resonance circuit are adjusted to be the resonance frequency $f_A$ of the coil part 520 ±25 MHz, but are not limited thereto. The frequencies may be adjusted so that the double-tuned surface coil 510 resonates at two different frequencies $f_1$ and $f_2$ to have sensitivity, and the inter-coil magnetic coupling prevention circuit 530 can provide a high impedance at the two frequencies $f_1$ and $f_2$.

Figure 16:
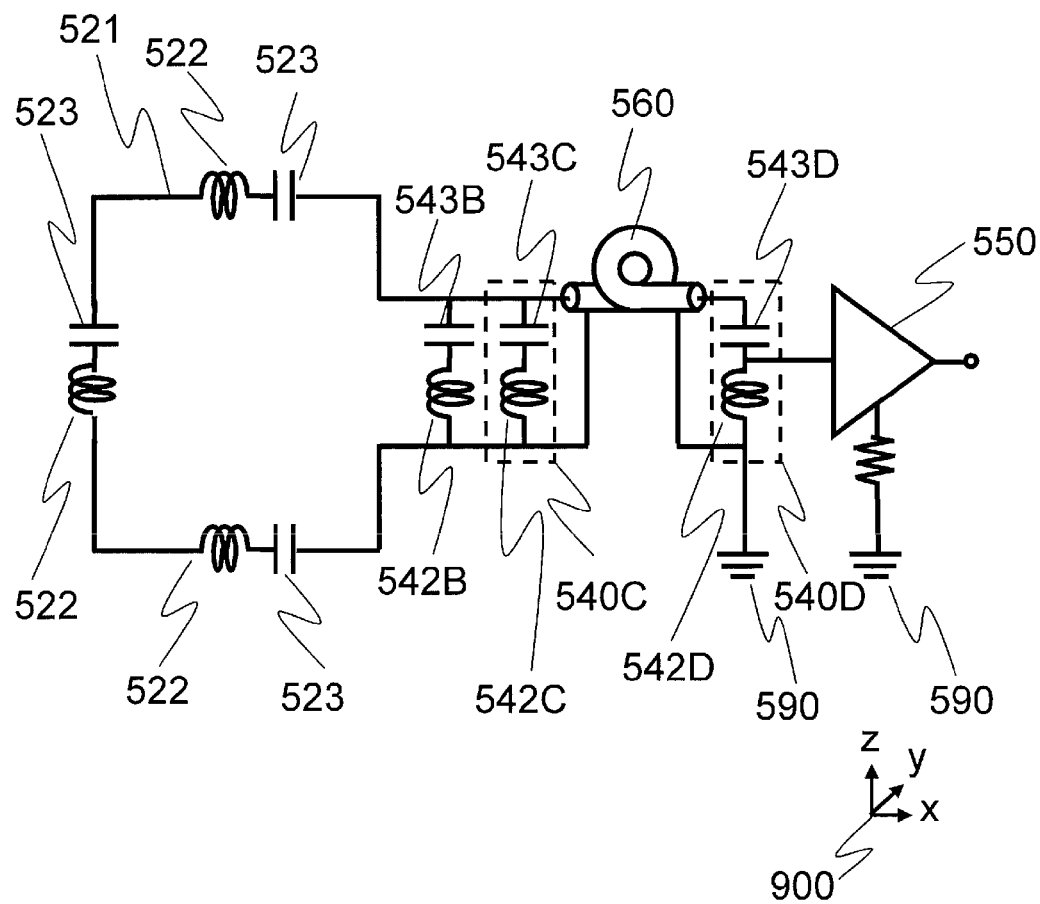
FIG. 16 is a circuit diagram of an example in which a coaxial line is inserted in the double-tuned surface coil of the first embodiment.

In addition, as shown in FIG. 16, a coaxial cable 560 may be inserted between the second serial resonance circuit 540C and the third serial resonance circuit 540D of the double-tuned surface coil 510 of this embodiment. In addition, a semi-rigid cable may be inserted in place of the coaxial cable 560. In this case, the value $L_D$ of the inductor 542D of the third serial resonance circuit 540D and the value $C_D$ of the capacitor 543D may be adjusted so that even when these coaxial lines are inserted, the inter-coil magnetic coupling prevention circuit 530 can provide a high impedance at $f_1$ and $f_2$.

In the modification example shown in FIG. 16, the coaxial transmission line is used as is. However, a balun function may be added to the coaxial line to eliminate common mode noise.

In addition, in the modification example shown in FIG. 16, the coaxial cable 560 which is a coaxial transmission line is inserted between the second serial resonance circuit 540C and the third serial resonance circuit 540D, but the insertion place is not limited thereto. For example, the coaxial cable 560 may be inserted between the coil part 520 and the first serial resonance circuit 540B. More than one coaxial cable may be inserted.

In addition, in the modification example shown in FIG. 16, the coaxial transmission line is inserted, but an element other than the coaxial transmission line may be inserted. For example, a circuit element such as an inductor or a capacitor may be inserted. In any case, the value $L_D$ of the inductor 542D and the value $C_D$ of the capacitor 543D are adjusted in consideration of the capacitive reactance and the inductive reactance of a circuit element to be inserted. In addition, the insertion position of a circuit element such as an inductor or a capacitor is not limited thereto.

In this embodiment, the case has been described in which the multi-element multi-tuned RF coil is used as a receive RF coilreceive RF coil, but the multi-element multi-tuned RF coil of this embodiment may be used as a transmit RF coil. Specifically, the pre-amplifier 550 of the double-tuned surface coil 510 of this embodiment may be used as a high-frequency magnetic field generator, and the output of the high-frequency magnetic field generator may be input to the third serial resonance circuit 540D.

In addition, the multi-element multi-tuned RF coil of this embodiment may be used as a transmission/receive RF coilreceive RF coil. Specifically, a changer may be inserted between the third serial resonance circuit 540D and the pre-amplifier 550 of the double-tuned surface coil 510 of this embodiment to perform switching so that the high-frequency magnetic field generator and the third serial resonance circuit 540D are connected to each other upon transmission, and the pre-amplifier 550 and the third serial resonance circuit 540D are connected to each other upon reception.

<<Second Embodiment>>

Next, a second embodiment to which the invention is applied will be described. An MRI device of this embodiment is basically similar to the first embodiment. However, in this embodiment, a QD coil which has a combination of two double-tuned surface coils 510 of the first embodiment and realizes a QD system is used as a receive RF coilreceive RF coil. Hereinafter, the description will be given, focusing on a configuration different from that of the first embodiment.

Figure 17:
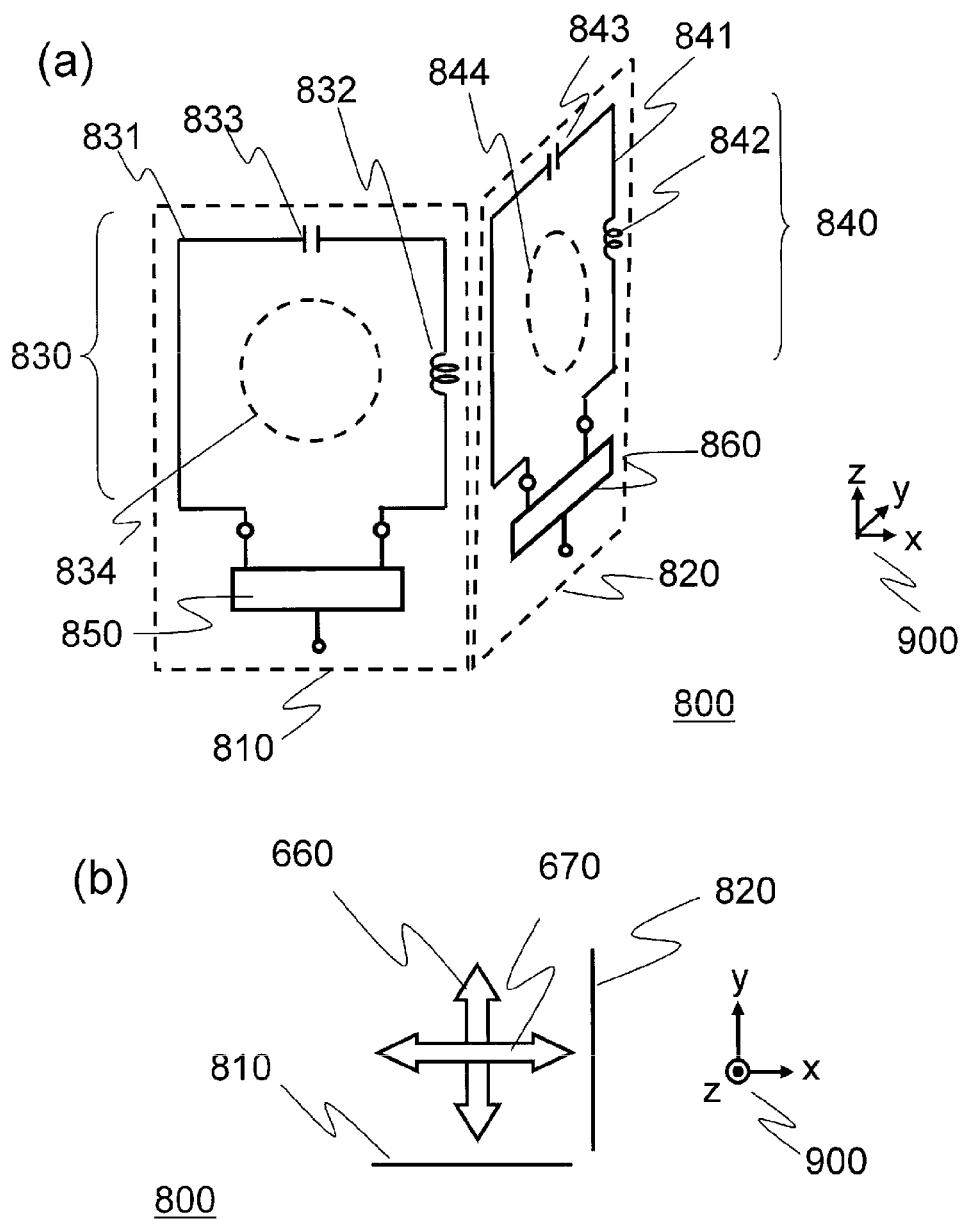
FIG. 17 shows (a) and (b) showing diagrams for illustrating a QD coil of a second embodiment.

FIG. 17 shows diagrams for illustrating a QD coil 800 which is used as a receive RF coilreceive RF coil 115 of this embodiment. FIG. 17(a) is a diagram for illustrating arrangement and a configuration of the QD coil 800. As shown in FIG. 17(a), the QD coil 800 of this embodiment is provided with a first double-tuned surface coil 810 and a second double-tuned surface coil 820.

Each of the first double-tuned surface coil 810 and the second double-tuned surface coil 820 has a configuration similar to that of the double-tuned surface coil 510 of the first embodiment. That is, the first double-tuned surface coil 810 and the second double-tuned surface coil 820 are provided with signal reception parts 830 and 840 corresponding to the coil part 520 of the double-tuned surface coil 510, and inter-element magnetic coupling prevention circuits 850 and 860 corresponding to the inter-coil magnetic coupling prevention circuit 530 of the double-tuned surface coil 510, respectively. The signal reception parts 830 and 840 are serial resonance circuits having an inductor and a capacitor connected in series as in the coil part 520. In FIG. 17, conductors 831 and 841, inductors 832 and 842, and capacitors 833 and 843 are representatively shown.

In addition, the circuit elements of the first double-tuned surface coil 810 and the second double-tuned surface coil 820 are adjusted so that the first double-tuned surface coil 810 and the second double-tuned surface coil 820 resonate at a first resonance frequency $f_1$ and a second resonance frequency $f_2$ ($>f_1$), respectively, as in the double-tuned surface coil 510 of the first embodiment.

In addition, the first double-tuned surface coil 810 and the second double-tuned surface coil 820 of the QD coil 800 of this embodiment are disposed so that loop surfaces 834 and 844 which are formed by the conductor 831 of the signal reception part 830 and the conductor 841 of the signal reception part 840, respectively, are parallel to the z axis. At this time, the loop surface 844 of the second double-tuned surface coil 820 is disposed so that the loop surface 834 of the first double-tuned surface coil 810 is rotated by 90 degrees around the z axis as a rotation axis.

FIG. 17(b) is a diagram of the QD coil 800 of this embodiment, viewed in the penetration direction of a static magnetic field (z-axis direction in FIG. 17(b)). As shown in FIG. 17(b), in the QD coil 800 of this embodiment, a direction 660 of a magnetic field which is formed by the first double-tuned surface coil 810 and a direction 670 of a magnetic field which is formed by the second double-tuned surface coil 820 are perpendicular to each other. Therefore, the first double-tuned surface coil 810 and the second double-tuned surface coil 820 are not magnetically coupled to each other, and independently operate as receive RF coilreceive RF coils with respect to two kinds of magnetic resonance signals.

Figure 18:
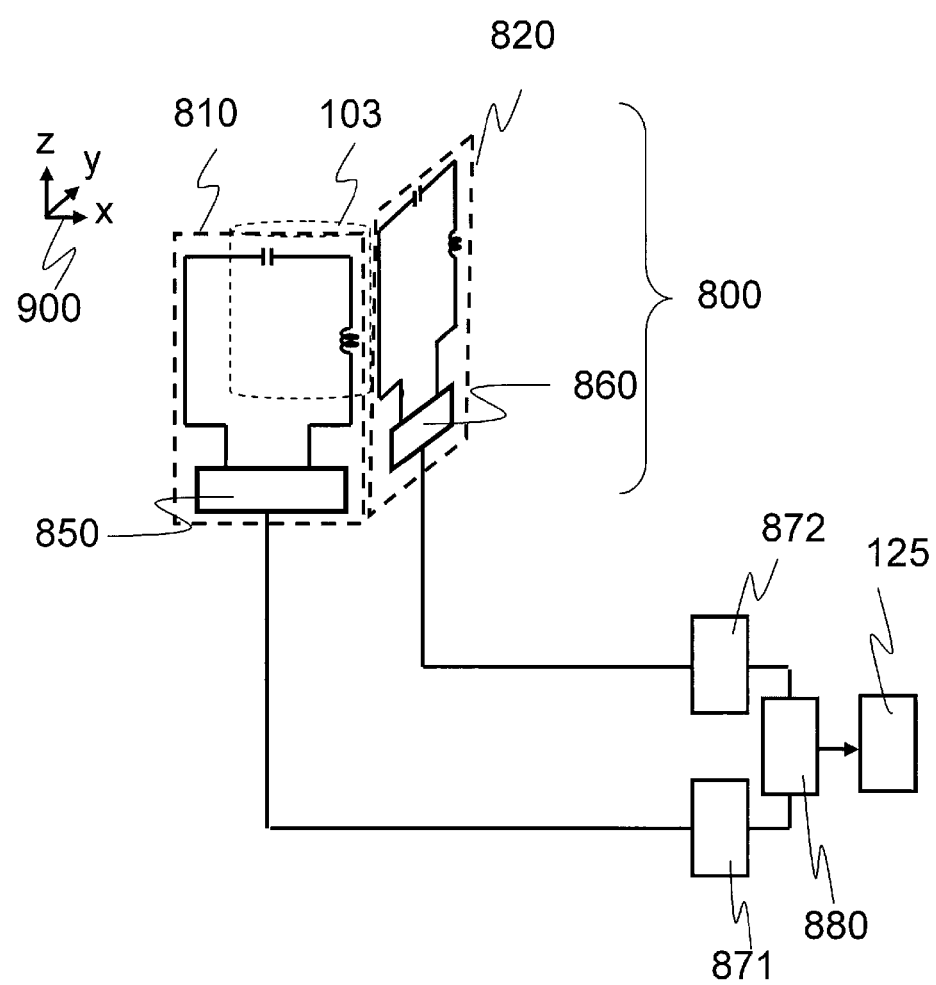
FIG. 18 is a diagram for illustrating connection between the QD coil of the second embodiment and a receiver.

FIG. 18 is a block diagram for illustrating connection between the QD coil 800 of this embodiment and a receiver 125. As shown in FIG. 18, the first double-tuned surface coil 810 and the second double-tuned surface coil 820 which constitute the QD coil 800 of this embodiment are respectively connected to the receiver 125 via phase adjusters 871 and 872 and a compositor 880 which are independently provided. The phase adjusters 871 and 872 match phases of nuclear magnetic resonance signals detected by the first double-tuned surface coil 810 and the second double-tuned surface coil 820. In addition, the compositor 880 composes the nuclear magnetic resonance signals after phase matching by the phase adjusters 871 and 872.

Next, an operation of the QD coil 800 of this embodiment will be described. The first double-tuned surface coil 810 and the second double-tuned surface coil 820 detect signal components perpendicular to each other, respectively, from a nuclear magnetic resonance signal having a first resonance frequency $f_1$ or a second resonance frequency $f_2$ which is generated from a test object 103. The detected signal components are processed by the phase adjusters 871 and 872, respectively, and then composed by the compositor 880 and sent to the receiver 125.

In this manner, the QD coil 800 of this embodiment realizes the reception of the QD system. In addition, each of the double-tuned surface coils 810 and 820 which constitute the QD coil 800 has a configuration similar to that of the double-tuned surface coil 510 of the first embodiment. Accordingly, as in the first embodiment, the double-tuned surface coils 810 and 820 resonate at two different frequencies $f_1$ and $f_2$ to have sensitivity, and mutual magnetic induction between the coil elements (double-tuned surface coils 810 and 820) can be eliminated at the frequencies $f_1$ and $f_2$.

As described above, the QD coil for the MRI device 100 of this embodiment is provided with a first RF coil and a second RF coil, the first RF coil and the second RF coil are disposed so that directions of magnetic fields to be formed by the first RF coil and the second RF coil are perpendicular to each other, and receive nuclear magnetic resonance signals having different phases by 90 degrees. At this time, each of the above-described first and second RF coils is provided with a plurality of multi-tuned RF coils having a plurality of different resonance frequencies, and each multi-tuned RF coil is provided with a coil part which transmits or receives a high-frequency signal, and an inter-coil magnetic coupling prevention circuit which is connected in parallel to the coil part and prevents magnetic coupling with another multi-tuned RF coil. The inter-coil magnetic coupling prevention circuit is provided with a tuning circuit which is connected in parallel to the coil part and makes the inter-coil magnetic coupling prevention circuit have a high impedance at the respective resonance frequencies of the multi-tuned RF coils, and a pre-amplifier which is connected to the output of the tuning circuit.

At this time, the tuning circuit is provided with serial resonance circuits having different resonance frequencies in which a capacitor and an inductor are connected in series, and the number of the serial resonance circuits is greater by at least one than the number of frequencies at which the multi-tuned RF coils resonate. The respective serial resonance circuits are connected in parallel, and the pre-amplifier is connected to a junction point between the capacitor and the inductor of any one of the serial resonance circuits of the tuning circuit. The respective serial resonance circuits of the tuning circuit and the coil part may be adjusted so that both of the tuning circuit and the circuit which is configured by the coil part and the serial resonance circuit to which the pre-amplifier is not connected resonate at a plurality of different resonance frequencies of the multi-tuned RF coils.

In addition, the resonance frequencies of the serial resonance circuits of the tuning circuit may be different from any of the resonance frequencies of the multi-tuned RF coils, and the resonance frequencies of the multi-tuned RF coils may be adjusted to be between the resonance frequencies of the serial resonance circuits.

Furthermore, the RF coil system for the MRI device 100 of this embodiment is an RF coil system of a magnetic resonance imaging device which is provided with a transmit RF coil, a receive RF coilreceive RF coil, and coupling prevention means between the transmit RF coil and the receive RF coilreceive RF coil. The receive RF coilreceive RF coil is the above-described QD coil, and the transmit RF coil can transmit a high-frequency signal having the resonance frequency of the multi-tuned RF coil of the RF coil. The coupling prevention means between the transmit RF coil and the receive RF coilreceive RF coil performs control to open the respective multi-tuned RF coils when transmitting the high-frequency signal, and to open the transmit RF coil when receiving the nuclear magnetic resonance signal.

In this manner, the QD coil 800 which is used as the receive RF coilreceive RF coil 115 of this embodiment realizes the QD system, and thus it is possible to detect magnetic resonance signals having two different frequencies at higher sensitivity, in addition to the effect of the double-tuned surface coil 510 of the first embodiment.

In this embodiment, the case in which two double-tuned surface coils 510 of the first embodiment are combined in order to realize the QD system has been described as an example. However, the shape of the coil part 520 of the double-tuned coil to be combined in order to realize the QD system is not limited thereto. A set of two double-tuned coils, each of which is provided with the coil part 520 and the inter-coil magnetic coupling prevention circuit 530, which can be disposed so that magnetic fields to be formed by the double-tuned coils are perpendicular to each other may be provided.

For example, two double-tuned coils having a coil part 520 formed into a saddle shape may be combined. In this case, the two double-tuned coils are disposed to be shifted from each other by 90 degrees with the z axis as a rotation axis. In addition, the coil part 520 may be a combination of a double-tuned solenoid coil formed into a solenoid shape and a double-tuned coil formed into a saddle shape. In this case, the coils are disposed so that cylinder directions of both of the coils are the same as each other.

In addition, in the embodiment, the case in which two single double-tuned surface coils 510 of the first embodiment are combined in order to realize the QD system has been described as an example. However, the coil to be combined in order to realize the QD system is not limited to the single double-tuned surface coil 510. For example, two sets of phased array coils 500 of the first embodiment may be used. In this case, both the phased array coils 500 are disposed to be shifted from each other by 90 degrees with the z axis as a rotation axis. By constituting the QD coil using the phased array coil 500 of the first embodiment, it is possible to obtain the effect of the phased array coil 500 in addition to the effect of this embodiment. Accordingly, imaging in a wide range can be performed at high sensitivity.

In the embodiments, a configuration may be employed in which the inter-coil magnetic coupling prevention circuit 530 is covered with a radio shield 690. Hereinafter, a configuration and an operation in the case of covering the inter-coil magnetic coupling prevention circuit 530 with the radio shield 690 will be described using the double-tuned surface coil 510 of the first embodiment as an example.

Figure 19:
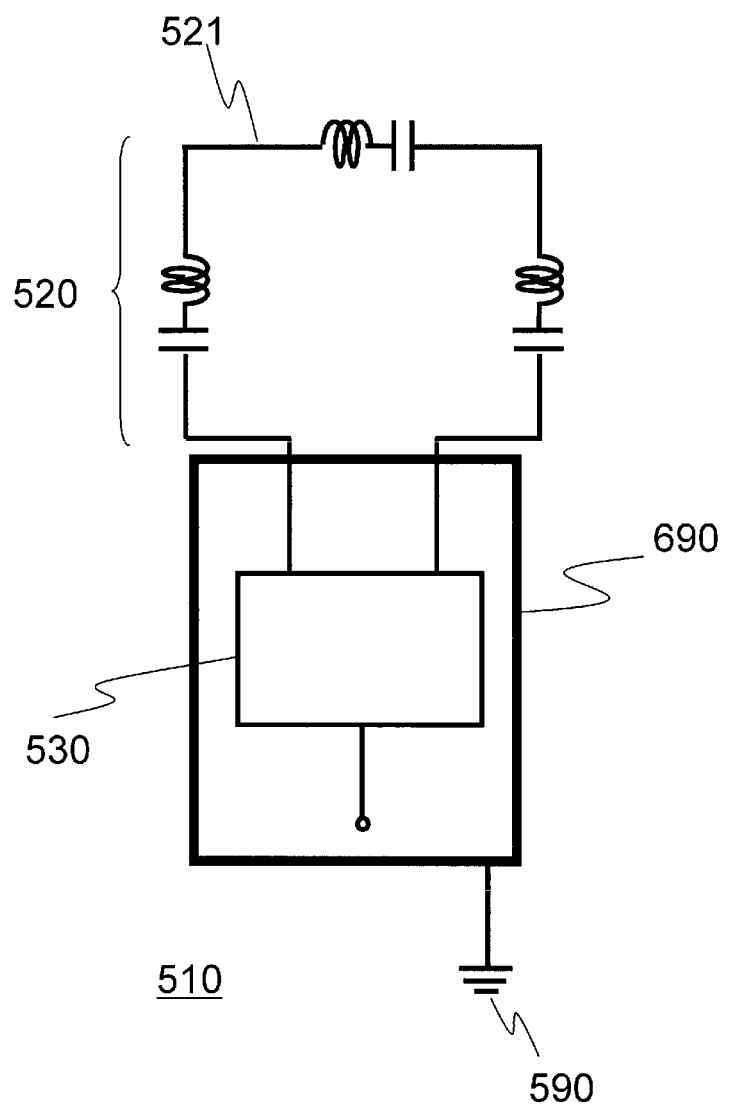
FIG. 19 is a diagram for illustrating an example in which a radio shield is installed in the double-tuned surface coil of the first embodiment.

FIG. 19 is a block diagram in the case of applying the radio shield 690 to the double-tuned surface coil 510 of the first embodiment. As shown in FIG. 19, here, apart other than the coil part 520 of the double-tuned surface coil 510, that is, the inter-coil magnetic coupling prevention circuit 530 is covered with the radio shield 690. The radio shield 690 is grounded to a ground 590.

By covering the inter-coil magnetic coupling prevention circuit 530 with the radio shield 690, it is possible to reduce the influences of high-frequency magnetic fields which are formed in the respective serial resonance circuits, that is, the first serial resonance circuit 540B, the second serial resonance circuit 540C, and the third serial resonance circuit 540D which constitute the inter-coil magnetic coupling prevention circuit 530 on a high-frequency magnetic field which is formed in the coil part 520. Therefore, according to this configuration, turbulence of the magnetic field which is formed in the coil part 520 is suppressed and a high-frequency magnetic field can thus be applied to the test object 103.

In addition, magnetic coupling between the first serial resonance circuit 540B, the second serial resonance circuit 540C, and the third serial resonance circuit 540D and the test object 103 can be prevented by the radio shield 690. That is, according to this configuration, loss caused by the influence of external noise and the magnetic coupling can be reduced.

In the embodiments, the magnetic coupling prevention circuits 640 and 650 and the magnetic coupling prevention circuit driving device 126 are used for the receive RF coilreceive RF coil 115 in order to eliminate magnetic coupling between the transmit RF coil 114 and the receive RF coilreceive RF coil 115, but the configuration for preventing the magnetic coupling between the transmit RF coil 114 and the receive RF coilreceive RF coil 115 is not limited thereto.

For example, the PIN diodes 641 and 651 of the magnetic coupling prevention circuits 640 and 650 may be replaced with a cross diode made by combining two PIN diodes having different polarity directions to produce a circuit from which the magnetic coupling prevention circuit driving device 126 is removed. According to this configuration, since the magnetic coupling prevention circuit driving device 126 is not required, the magnetic coupling between the transmit RF coil 114 and the receive RF coilreceive RF coil 115 can be eliminated with a simple circuit configuration. Accordingly, it is possible to increase image quality with a simpler configuration than in the embodiments.

In addition, in the embodiments, the multi-element double-tuned RF coil which can detect nuclear magnetic resonance signals of two nuclides has been described as an example of a multi-element multi-tuned RF coil, but the number of detectable nuclides is not limited two, and may be three or more. In this case, the tuning circuit 540 is configured to provide a high impedance to the output of the coil part 520 at a plurality of different frequencies. This configuration can be realized by making the number of serial resonance circuits of the tuning circuit 540 greater by at least one than the number of resonance frequencies.

At this time, as in the embodiments, the respective circuit elements may be adjusted so that the tuning circuit 540 and the circuit which is configured by the coil part 520 and the serial resonance circuit excluding the serial resonance circuit which is connected to the pre-amplifier 550 of the tuning circuit 540 resonate at the resonance frequencies of the multi-tuned RF coils.

REFERENCE SIGNS LIST

102: TABLE
103: TEST OBJECT
111: MAGNET
112: GRADIENT MAGNETIC FIELD COIL
113: SHIM COIL
114: TRANSMIT RF COIL
115: RECEIVE RF COILRECEIVE RF COIL
122: GRADIENT MAGNETIC FIELD POWER SOURCE
123: SHIM POWER SOURCE
124: HIGH-FREQUENCY MAGNETIC FIELD GENERATOR
125: RECEIVER
126: MAGNETIC COUPLING PREVENTION CIRCUIT DRIVING DEVICE
130: CALCULATOR
131: SEQUENCER
132: STORING MEDIUM
133: DISPLAY DEVICE
400: BIRDCAGE RF COIL
401: RECTILINEAR CONDUCTOR
402: END CONDUCTOR
403: CAPACITOR
411: FIRST PORT
412: SECOND PORT
500: PHASED ARRAY COIL
510: DOUBLE-TUNED SURFACE COIL
511: DOUBLE-TUNED SADDLE-TYPE COIL
512: DOUBLE-TUNED BUTTERFLY-TYPE COIL
513: DOUBLE-TUNED SOLENOID COIL
520: COIL PART
521: CONDUCTOR
522: INDUCTOR
523: CAPACITOR
530: INTER-ELEMENT MAGNETIC COUPLING PREVENTION CIRCUIT
540: TUNING CIRCUIT
540B: FIRST SERIAL RESONANCE CIRCUIT
540C: SECOND SERIAL RESONANCE CIRCUIT
540D: THIRD SERIAL RESONANCE CIRCUIT
542B: INDUCTOR
542C: INDUCTOR
542D: INDUCTOR
543B: CAPACITOR
543C: CAPACITOR
543D: CAPACITOR
550: PRE-AMPLIFIER
560: COAXIAL CABLE
590: GROUND
600: GRAPH
610: SOLID LINE
620: BROKEN LINE
640: MAGNETIC COUPLING PREVENTION CIRCUIT BETWEEN TRANSMIT RF COIL AND RECEIVE RF COIL
641: PIN DIODE
642: CONTROL SIGNAL LINE
650: MAGNETIC COUPLING PREVENTION CIRCUIT BETWEEN TRANSMIT RF COIL AND RECEIVE RF COIL
651: PIN DIODE
652: CONTROL SIGNAL LINE
553: INDUCTOR 660: DIRECTION OF MAGNETIC FIELD
670: DIRECTION OF MAGNETIC FIELD
690: SHIELD
700: EQUIVALENT CIRCUIT
710A: EQUIVALENT CIRCUIT
710B: EQUIVALENT CIRCUIT
710C: EQUIVALENT CIRCUIT
710D: EQUIVALENT CIRCUIT
712A: INDUCTOR
712B: INDUCTOR
712C: INDUCTOR
712D: INDUCTOR
713A: CAPACITOR
713B: CAPACITOR
713C: CAPACITOR
713D: CAPACITOR
720: EQUIVALENT CIRCUIT
721: EQUIVALENT CIRCUIT
722: EQUIVALENT CIRCUIT
723: CAPACITOR
724: INDUCTOR
725: CAPACITOR
726: INDUCTOR
727: INDUCTOR
728: CAPACITOR
730: EQUIVALENT CIRCUIT
750: SERIAL RESONANCE CIRCUIT
752: INDUCTOR
753: CAPACITOR
800: QD COIL
810: FIRST DOUBLE-TUNED SURFACE COIL
820: SECOND DOUBLE-TUNED SURFACE COIL
830: SIGNAL RECEPTION PART
831: CONDUCTOR
832: INDUCTOR
833: CAPACITOR
834: LOOP SURFACE
840: SIGNAL RECEPTION PART
841: CONDUCTOR
842: INDUCTOR
843: CAPACITOR
844: LOOP SURFACE
850: INTER-ELEMENT MAGNETIC COUPLING PREVENTION CIRCUIT

860: INTER-ELEMENT MAGNETIC COUPLING PREVENTION CIRCUIT
871: PHASE ADJUSTER
872: PHASE ADJUSTER
880: COMPOSITOR
900: COORDINATE SYSTEM
910: SINGLE-TUNED SURFACE COIL
911: CONDUCTOR
912: INDUCTOR
913: CAPACITOR
922: INDUCTOR
923: CAPACITOR
930: IMPEDANCE MATCHING CIRCUIT
940: PRE-AMPLIFIER

The invention claimed is:

1. An RF coil for a magnetic resonance imaging device, comprising:
a plurality of multi-tuned RF coils which have a plurality of different resonance frequencies,
wherein each multi-tuned RF coil is provided with
a coil part which transmits or receives high-frequency signals, and
an inter-coil magnetic coupling prevention circuit which is connected in parallel to the coil part and prevents magnetic coupling with another multi-tuned RF coil, and
the inter-coil magnetic coupling prevention circuit is provided with
a tuning circuit which is connected in parallel to the coil part and makes the inter-coil magnetic coupling prevention circuit have a high impedance at the respective resonance frequencies of the multi-tuned RF coils, and
a pre-amplifier which is connected to the output of the tuning circuit.

2. The RF coil according to claim 1,
wherein the tuning circuit is provided with serial resonance circuits having different resonance frequencies in which a capacitor and an inductor are connected in series, the number of which is greater by at least one than the number of frequencies at which the multi-tuned RF coils resonate,
the serial resonance circuits are connected in parallel,
the pre-amplifier is connected to a junction point between the capacitor and the inductor of any one of the serial resonance circuits of the tuning circuit, and
the respective serial resonance circuits of the tuning circuit and the coil part are adjusted so that both of the tuning circuit and the circuit which is configured by the coil part and the serial resonance circuit to which the pre-amplifier is not connected resonate at a plurality of different resonance frequencies of the multi-tuned RF coils.

3. The RF coil according to claim 2,
wherein the resonance frequencies of the serial resonance circuits of the tuning circuit are different from any of the resonance frequencies of the multi-tuned RF coils, and the resonance frequencies of the multi-tuned RF coils are adjusted to be between the resonance frequencies of the serial resonance circuits.

4. The RF coil according to claim 2,
wherein the multi-tuned RF coils have resonance frequencies represented by $f_1$ and $f_2$, respectively,
the coil part is provided with a loop coil formed of a conductor and a capacitor inserted in the loop coil, and has a resonance frequency represented by $f_A$, the tuning circuit is provided with
a first serial resonance circuit which is provided with a capacitor and an inductor and connected in parallel to the coil part, and has a resonance frequency represented by $f_B$,
a second serial resonance circuit which is provided with a capacitor and an inductor and connected in parallel to the first serial resonance circuit, and has a resonance frequency represented by $f_C$, and
a third serial resonance circuit which is provided with a capacitor and an inductor and connected in parallel to the second serial resonance circuit, and has a resonance frequency represented by $f_D$,
the resonance frequencies are adjusted so as to satisfy $f_B<f_1<f_A<f_2<f_C$ and $f_B<f_1<f_D<f_2<f_C$, and
the pre-amplifier is connected to a junction point between the capacitor and the inductor of the third serial resonance circuit.

5. The RF coil according to claim 1,
wherein the coil part is provided with two saddle-shaped parts which are disposed to be opposed to a surface of a cylinder, and
the saddle-shaped parts are connected so that magnetic fields to be formed by the saddle-shaped parts are in the same direction.

6. The RF coil according to claim 1,
wherein the coil part is provided with two conductor loop parts which are disposed next to each other in a substantially same plane, and
the conductor loop parts are connected so that magnetic fields to be formed by the conductor loops are in opposite directions and a butterfly shape is formed.

7. The RF coil according to claim 1,
wherein the coil part has a solenoid shape.

8. The RF coil according to claim 1,
wherein each of the multi-tuned RF coils is provided with a radio shield which covers a part other than the coil part of the multi-tuned RF coil.

9. The RF coil according to claim 1,
wherein the plurality of multi-tuned RF coils constitute a phased array coils in which the multi-tuned RF coils are disposed in a substantially same plane so that the coil parts of the multi-tuned RF coils partially overlap each other.

10. A QD coil for a magnetic resonance imaging device, comprising:
a first RF coil which is constituted by the RF coil according to claim 1; and
a second RF coil which is constituted by the RF coil according to claim 1,
wherein the first RF coil and the second RF coil are disposed so that directions of magnetic fields to be formed by the first RF coil and the second RF coil are perpendicular to each other, and receive nuclear magnetic resonance signals having different phases by 90 degrees.

11. An RF coil system for a magnetic resonance imaging device which is provided with a transmit RF coil, a receive RF coil, and coupling prevention means between the transmit RF coil and the receive RF coil,
wherein the receive RF coil is the RF coil according to claim 1,
the transmit RF coil can transmit high-frequency signals having a resonance frequency of the multi-tuned RF coil of the RF coil, and
the coupling prevention means between the transmit RF coil and the receive RF coil performs control to open the respective multi-tuned RF coils when transmitting the high-frequency signals, and to open the transmit RF coil when receiving the high-frequency signals.

12. The RF coil system according to claim 11, wherein the coupling prevention means between the transmit RF coil and the receive RF coil is provided with a diode, and the diode is switched ON or OFF by an external control signal, and thus the control is realized.

13. The RF coil system according to claim 11, wherein the coupling prevention means between the transmit RF coil and the receive RF coil is provided with a cross diode made by connecting two diodes in opposite directions.

14. A magnetic resonance imaging device comprising:
static magnetic field forming means for forming a static magnetic field;
gradient magnetic field application means for applying a gradient magnetic field;
a transmit RF coil which applies high-frequency magnetic fields to a test object;
a receive RF coil which receives nuclear magnetic resonance signals from the test object; and
control means for controlling operations of the gradient magnetic field application means, the transmit RF coil, and the receive RF coil,
wherein the receive RF coil is the RF coil according to claim 1.

15. An RF coil system for a magnetic resonance imaging device which is provided with a transmit RF coil, a receive RF coil, and coupling prevention means between the transmit RF coil and the receive RF coil,
wherein the receive RF coil is the QD coil according to claim 10,
the transmit RF coil can transmit high-frequency signals having a resonance frequency of the multi-tuned RF coil of the RF coil, and
the coupling prevention means between the transmit RF coil and the receive RF coil performs control to open the multi-tuned RF coils when transmitting the high-frequency signals, and to open the transmit RF coil when receiving the nuclear magnetic resonance signal.

16. A magnetic resonance imaging device comprising:
static magnetic field forming means for forming a static magnetic field;
gradient magnetic field application means for applying a gradient magnetic field;
a transmit RF coil which applies high-frequency magnetic fields to a test object;
a receive RF coil which receives nuclear magnetic resonance signals from the test object; and
control means for controlling operations of the gradient magnetic field application means, the transmit RF coil, and the receive RF coil,
wherein the receive RF coil is the QD coil according to claim 10.

* * * * *